United States Patent
Hemink

(10) Patent No.: US 7,173,859 B2
(45) Date of Patent: Feb. 6, 2007

(54) FASTER PROGRAMMING OF HIGHER LEVEL STATES IN MULTI-LEVEL CELL FLASH MEMORY

(75) Inventor: Gerrit Jan Hemink, Yokohama (JP)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/099,259

(22) Filed: Apr. 5, 2005

(65) Prior Publication Data
US 2006/0120165 A1 Jun. 8, 2006

Related U.S. Application Data

(63) Continuation-in-part of application No. 10/990,702, filed on Nov. 16, 2004, now Pat. No. 7,092,290.

(51) Int. Cl.
*G11C 16/04* (2006.01)
(52) U.S. Cl. .................. 365/185.28; 365/185.03; 365/185.19
(58) Field of Classification Search ........... 365/185.03, 365/185.17, 185.18, 185.19, 185.22, 185.28
See application file for complete search history.

(56) References Cited

U.S. PATENT DOCUMENTS

| | | | |
|---|---|---|---|
| 5,220,531 A | 6/1993 | Blyth et al. | |
| 5,313,421 A | 5/1994 | Guterman et al. | |
| 5,386,422 A | 1/1995 | Endoh et al. | |
| 5,412,601 A | 5/1995 | Sawada et al. | |
| 5,521,865 A | 5/1996 | Ohuchi et al. | |
| 5,570,315 A | 10/1996 | Tanaka et al. | |
| 5,652,719 A | 7/1997 | Tanaka et al. | |
| 5,712,180 A | 1/1998 | Guterman et al. | |
| 5,712,815 A | 1/1998 | Bill et al. | |

(Continued)

FOREIGN PATENT DOCUMENTS

EP 0877386 11/1998

(Continued)

OTHER PUBLICATIONS

Kurata, Hideaki, et al., Constant-Charge-Injection Programming for 10-MB/s Multilevel AG-AND Flash Memories. 2002 Symposium On VLSI Circuits Digest of Technical Papers, pp. 302-303.

(Continued)

*Primary Examiner*—Gene N. Auduong
(74) *Attorney, Agent, or Firm*—Vierra Magen Marcus & DeNiro LLP

(57) ABSTRACT

A program voltage signal implemented as a series of increasing program voltage pulses is applied to a set of non-volatile storage elements. Different increment values can be used when programming memory cells to different memory states. A smaller increment value can be used when programming memory cells to lower threshold voltage memory states and a larger increment value used when programming memory cells to higher threshold voltage memory states such as the highest memory state in an implementation. When non-volatile storage elements of a set are programmed to different memory states under simultaneous application of a single program voltage signal, programming can be monitored to determine when lower state programming is complete. The increment value can then be increased to complete programming to the highest memory state. Coarse/fine programming methodology can be incorporated for the highest memory state when the increment value is increased to maintain the threshold distribution within a reasonable range.

45 Claims, 17 Drawing Sheets

U.S. PATENT DOCUMENTS

| | | | |
|---|---|---|---|
| 5,761,222 | A | 6/1998 | Baldi |
| 5,870,344 | A | 2/1999 | Ozawa |
| 5,926,409 | A | 7/1999 | Engh et al. |
| 5,949,714 | A | 9/1999 | Hemink et al. |
| 5,969,986 | A | 10/1999 | Wong et al. |
| 6,151,248 | A | 11/2000 | Harari et al. |
| 6,222,762 | B1 | 4/2001 | Guterman et al. |
| 6,226,270 | B1 | 5/2001 | Chiku et al. |
| 6,243,290 | B1 | 6/2001 | Kurata et al. |
| 6,278,632 | B1 | 8/2001 | Chevallier |
| 6,301,161 | B1 | 10/2001 | Holzmann et al. |
| 6,317,364 | B1 | 11/2001 | Guterman et al. |
| 6,343,033 | B1 | 1/2002 | Parker et al. |
| 6,373,748 | B2 | 4/2002 | Ikehashi et al. |
| 6,424,566 | B1 | 7/2002 | Parker |
| 6,490,201 | B2 | 12/2002 | Sakamoto |
| 6,496,410 | B1 * | 12/2002 | Parker ............... 365/185.03 |
| 6,496,418 | B2 | 12/2002 | Kawahara et al. |
| 6,519,184 | B2 | 2/2003 | Tanaka et al. |
| 6,522,580 | B2 | 2/2003 | Chen et al. |
| 6,525,964 | B2 | 2/2003 | Tanaka et al. |
| 6,529,412 | B1 | 3/2003 | Chen et al. |
| 6,532,172 | B2 | 3/2003 | Harari et al. |
| 6,535,428 | B2 | 3/2003 | Pasotti et al. |
| 6,590,811 | B1 | 7/2003 | Hamilton et al. |
| 6,643,188 | B2 | 11/2003 | Tanaka et al. |
| 6,657,891 | B1 | 12/2003 | Shibata et al. |
| 6,714,457 | B1 * | 3/2004 | Hsu et al. ............. 365/185.28 |
| 6,738,289 | B2 | 5/2004 | Gongwer |
| 6,809,962 | B2 | 10/2004 | Uribe et al. |
| 6,891,757 | B2 * | 5/2005 | Hosono et al. ........ 365/185.19 |
| 6,937,520 | B2 * | 8/2005 | Ono et al. ............. 365/185.18 |
| 6,958,934 | B2 | 10/2005 | Fan et al. |
| 2002/0118574 | A1 | 8/2002 | Gongwer et al. |

FOREIGN PATENT DOCUMENTS

| | | |
|---|---|---|
| EP | 1249842 | 10/2002 |
| EP | 1426968 | 6/2004 |
| WO | WO 98/28745 | 7/1998 |

OTHER PUBLICATIONS

Johnson, William S., et al., Session XII: ROMs, PROMs and EROMs, 1980 IEEE International Solid State Circuits Conference, pp. 152-153.

Nobukata, Hiromi, et al., A 144Mb 8-Level NAND Flash Memory with Optimized Pulse Width Programming, 1999 Symposium on VLSI Circuits Digest of Technical Papers, pp. 39-40.

Ohkawa, Masayoshi, et al., TP 2.3: A 98 mm2 3.3V 64Mb Flash Memory with FN-NOR Type 4-level Cell, 1996 IEEE International Solid-State Circuits Conference, pp. 36-37.

* cited by examiner

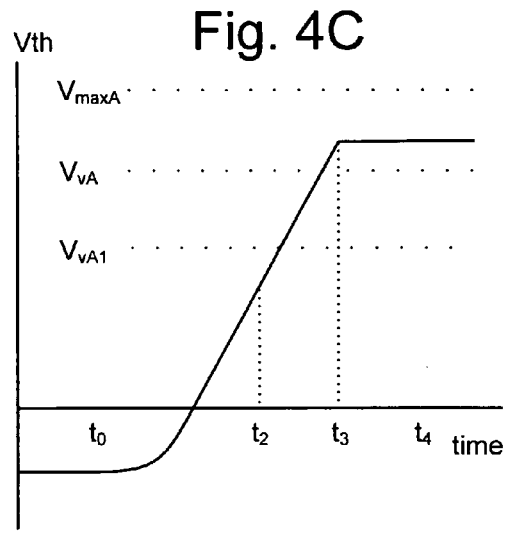
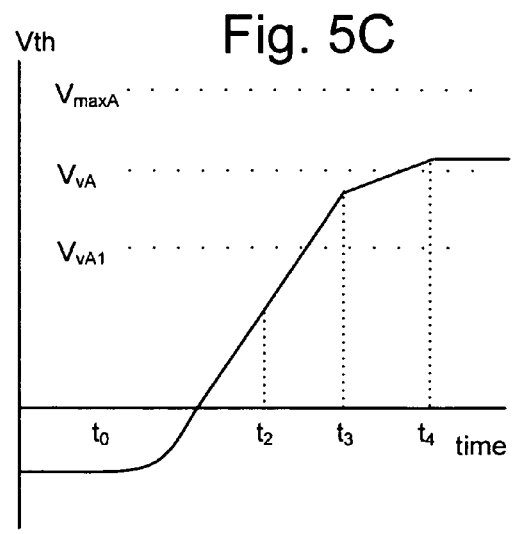
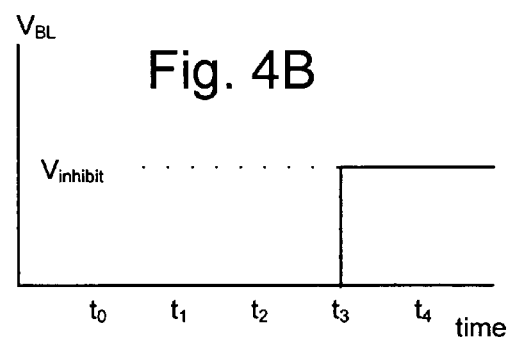
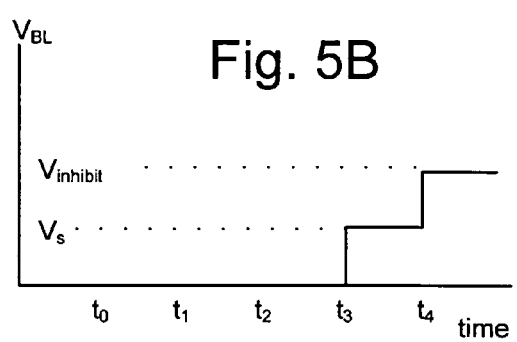
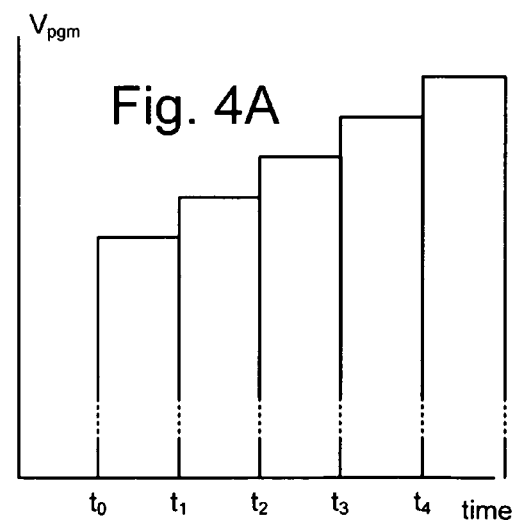
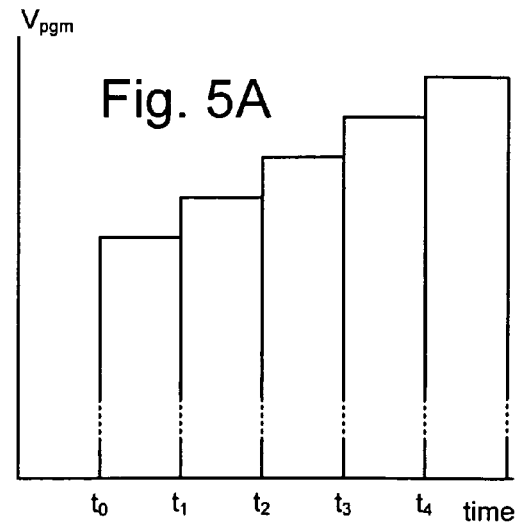

| Wordline | Upper/ Lower Page | All Bit Lines |
|---|---|---|
| WL3 | upper | Page 7 |
| | lower | Page 5 |
| WL2 | upper | Page 6 |
| | lower | Page 3 |
| WL1 | upper | Page 4 |
| | lower | Page 1 |
| WL0 | upper | Page 2 |
| | lower | Page 0 |

Fig. 14A

| Wordline | Upper/ Lower Page | Even Bit Lines | Odd Bit Lines |
|---|---|---|---|
| WL3 | upper | Page 14 | Page 15 |
| | lower | Page 10 | Page 11 |
| WL2 | upper | Page 12 | Page 13 |
| | lower | Page 6 | Page 7 |
| WL1 | upper | Page 8 | Page 9 |
| | lower | Page 2 | Page 3 |
| WL0 | upper | Page 4 | Page 5 |
| | lower | Page 0 | Page 1 |

Fig. 14B

FASTER PROGRAMMING OF HIGHER LEVEL STATES IN MULTI-LEVEL CELL FLASH MEMORY

PRIORITY INFORMATION

This application is a continuation-in-part application of U.S. patent application Ser. No. 10/990,702, entitled, "HIGH SPEED PROGRAMMING SYSTEM WITH REDUCED OVERPROGRAMMING," filed Nov. 16, 2004, now U.S. Pat. No. 7,092,290, incorporated by reference herein in its entirety.

BACKGROUND OF THE INVENTION

1. Field of the Invention

The present invention relates to programming non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

Some EEPROM and flash memory devices have a floating gate that is used to store two ranges of charges and, therefore, the memory cell can be programmed/erased between two states (an erased state and a programmed state). For example, FIG. 1 shows a graph depicting two threshold voltage distributions. The x axis plots threshold voltage and the y axis plots the number of memory cells. Threshold voltage distribution 2 is less than zero volts. In one embodiment, threshold voltage distribution 2 corresponds to erased memory cells that store data "1." Threshold voltage distribution 4 is greater than zero volts. In one embodiment, threshold voltage distribution 4 corresponds to programmed memory cells that store data "0."

A multi-state flash memory cell is implemented by identifying multiple, distinct allowed threshold voltage ranges separated by forbidden voltage ranges. Each distinct threshold voltage range corresponds to a predetermined value for the set of data bits. FIG. 2 illustrates threshold voltage distributions for memory cells storing two bits of data (e.g., four data states). In one embodiment, threshold voltage distribution 2 represents memory cells that are in the erased state (e.g., storing "11"), having negative threshold voltage levels. Threshold voltage distribution 10 represents memory cells that store data "10," having positive threshold voltage levels. Threshold voltage distribution 12 represents memory cells storing data "00." Threshold voltage distribution 14 represents memory cells that are storing "01." In some implementations (as exemplified above), these data values (e.g. logical states) are assigned to the threshold ranges using a gray code assignment so that if the threshold voltage of a floating gate erroneously shifts to its neighboring physical state, only one logical bit will be affected. In other embodiments, each of the distributions can correspond to different data states than described above. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. Additionally, embodiments in accordance with the present invention are applicable to memory cells that store more than two bits of data.

Threshold voltage distributions 2 and 4 show the erased and programmed voltage-distributions when no verify operations are used. These distributions can be obtained by programming or erasing the memory cells with one single programming or erase pulse. Depending on the memory array size and the variations in the production process, the threshold voltage distribution 4 has a certain width, known as the natural $V_{th}$ width.

As can be seen from FIG. 2, distributions 10, 12, and 14 (corresponding to programming a multi-state device) need to be much narrower than the natural $V_{th}$ width of distribution 4. To achieve such narrower threshold voltage distributions, a process that uses multiple programming pulses and verify operations, such as that described by FIGS. 3A, 3B, and 3C, can be used.

FIG. 3A depicts a programming voltage signal $V_{pgm}$ that is applied to the control gate as a series of pulses. The magnitude of the pulse is increased with each successive pulse by a pre-determined step size (e.g., 0.2 v–0.4 v), depicted in FIG. 3A as $\Delta V_{pgm}$. In the periods between the pulses, verify operations are carried out. As the number of programmable states increase, the number of verify operations increases and more time is needed. One means for reducing the time-burden is a more efficient verification process, such as the process that is disclosed in U.S. patent application Ser. No. 10/314,055 entitled, "Smart Verify For Multi-State Memories," filed Dec. 5, 2002, incorporated herein by reference in its entirety. In reality, the pulses of FIG. 3A are separated from each other by a time period for verification. However, to make FIG. 3 more readable, the time period for verification is omitted from the drawing.

FIG. 3B depicts the voltage signal applied to a bit line for the associated memory cell being programmed. FIG. 3C depicts the threshold voltage of the memory cell being programmed. Note that the graph in FIG. 3C is smoothed out to make it easier to read. After each programming pulse, a verify operation is carried out (not shown.) During the verify operation, the threshold voltage of the memory cell to be programmed is checked. If the threshold voltage of the memory cell is larger than the target value (e.g., $V_{verify}$), then programming for that memory cell is inhibited in the next cycle by raising the bit line voltage from 0 v to $V_{inhibit}$ (e.g., at time $t_4$).

As with other electronic devices, there is a consumer demand for memory devices to program as fast as possible. For example, the user of a digital camera that stores images on a flash memory card does not want to wait between pictures for an unnecessary long period of time. In addition to programming with reasonable speed, to achieve proper data storage for a multi-state memory cell, the multiple ranges of threshold voltages of the multi-state memory cells should be separated from each other by sufficient margin so that the level of the memory cell can be programmed and read in an unambiguous manner. A tight threshold voltage distribution is recommended. To achieve a tight threshold voltage distribution, small program steps have typically been used, thereby programming the threshold voltage of the cells more slowly. The tighter the desired threshold voltage distribution the smaller the steps and the slower the programming process.

One solution for achieving tight threshold voltage distributions, without unreasonably slowing down the programming process, includes using a two-phase programming process. The first phase, a coarse programming phase, includes an attempt to raise a threshold voltage in a faster manner while paying less attention to achieving a tight threshold voltage distribution. The second phase, a fine programming phase, attempts to raise the threshold voltage in a slower manner in order to reach the target threshold voltage, thus achieving a tighter threshold voltage distribution. One example of a coarse/fine programming methodology can be found in U.S. Pat. No. 6,643,188, incorporated herein by reference in its entirety.

FIGS. 4 and 5 provide more detail of one example of a coarse/fine programming methodology. FIGS. 4A and 5A depict the programming pulses $V_{pgm}$ applied to the control gate. FIGS. 4B and 5B depict the bit line voltages for the memory cells being programmed. FIGS. 4C and 5C depict the threshold voltage of the memory cells being programmed. This example of FIGS. 4 and 5 depicts programming of memory cells to state A using two verify levels, indicated in the Figures as $V_{vA1}$ and $V_{vA}$. The final target level is $V_{vA}$. When a threshold voltage of the memory cell has reached $V_{vA}$, the memory cell will be inhibited from further programming by applying an inhibit voltage to the bit line corresponding to that memory cell. For example, the bit line voltage can be raised to $V_{inhibit}$ (See FIG. 4B and FIG. 5B). However, when a memory cell has reached a threshold voltage close to (but lower than) the target value $V_{vA}$, the threshold voltage shift of the memory cell during subsequent programming pulses is slowed down by applying a certain bias voltage to the bit line, typically on the order of 0.3 v to 0.8 v. Because the rate of threshold voltage shift is reduced during the next few programming pulses, the final threshold voltage distribution can be narrower than with the methods depicted in FIG. 3. To implement this method, a second verify level that is lower than that of $V_{vA}$ is used. This second verify level is depicted in FIGS. 4 and 5 as $V_{vA1}$. When the threshold voltage of the memory cell is larger than $V_{vA1}$, but still lower than $V_{vA}$, the threshold voltage shift to the memory cell will be reduced for subsequent programming pulses by applying a bit line bias $V_s$ (FIG. 5B). Note that in this case, two verify operations are required for each state. One verify operation at the corresponding final verify level (e.g., $V_{vA}$) for each state to which the coarse/fine programming methodology is applied, and one verify operation at the corresponding second verify level (e.g., $V_{vA1}$) for each state. This may increase the total time needed to program the memory cells. However, a larger $\Delta V_{pgm}$ step size can be used to speed up the process.

FIGS. 4A, 4B, and 4C show the behavior of a memory cell whose threshold voltage moves past $V_{vA1}$ and $V_{vA}$ in one programming pulse. For example, the threshold voltage is depicted in FIG. 4C to pass $V_{vA1}$ and $V_{vA}$ in between $t_2$ and $t_3$. Thus, prior to $t_3$, the memory cell is in the coarse phase. After t3, the memory cell is in the inhibit mode.

FIGS. 5A, 5B, and 5C depict a memory cell that enters both the coarse and fine programming phases. The threshold voltage of the memory cell crosses $V_{vA1}$ in between time $t_2$ and time $t_3$. Prior to $t_3$, the memory cell is in the coarse phase. After $t_3$, the bit line voltage is raised to Vs to place the memory cell in the fine phase. In between $t_3$ and $t_4$, the threshold voltage of the memory cell crosses $V_{vA}$. Therefore, the memory cell is inhibited from further programming by raising the bit line voltage to $V_{inhibit}$.

Typically, in order to maintain reasonable programming times, coarse/fine programming algorithms are not applied to the highest memory state (the state corresponding to the largest positive threshold voltage range). The highest state, such as state C represented by distribution 14 in FIG. 2, does not need to be differentiated from a higher state. Typically, it is only necessary to program cells for this state above a minimum threshold level to differentiate from the next lowest state (e.g., state B represented by distribution 12). Thus, the distribution of these cells can occupy a wider threshold voltage range without adverse effects on device performance. Coarse/fine programming methodologies require more verify steps as described above. Moreover, the use of coarse/fine programming methodologies may increase the total number of required programming pulses. Since the highest threshold voltage state does not require as tight a threshold voltage distribution in most cases, coarse/fine programming is typically not used so as to decrease overall programming times.

In addition to increased programming times, the use of coarse/fine programming methodology for the highest threshold voltage state can increase the occurrence of program disturb within flash memory devices implemented with the NAND architecture (described more fully hereinafter). To apply a program voltage to the control gate of a selected cell on a selected NAND string, the program voltage is applied on the appropriate word line. This word line will also be connected to a memory cell on every other NAND string in the selected block of memory cells. Some of these memory cells may not be intended for programming. A problem arises when it's desired to program one cell on a word line without programming other cells connected to the same word line. Because the program voltage is applied to all cells connected to a word line, an unselected cell (a cell that is not to be programmed) connected to the word line may become inadvertently programmed. The unintentional programming of the unselected cell on the selected word line is referred to as "program disturb."

While various techniques exist for eliminating or limiting program disturb, many architects choose not to use coarse/fine programming algorithms for the highest threshold voltage memory state in order to further decrease the potential for program disturb. Program disturb occurs most often under application of large program voltages to a word line. The increased number of programming pulses required by coarse/fine programming can lead to the program voltage reaching a higher level than would be reached were coarse/ fine programming not used. Accordingly, many implementations of the NAND architecture do not apply coarse/fine programming for the highest threshold voltage state to minimize the occurrence of program disturb.

Despite the use of such techniques as coarse/fine programming to decrease programming times for flash memory, a further need to increase device performance by decreasing programming time exists.

SUMMARY OF THE INVENTION

The technology described herein attempts to decrease programming times associated with non-volatile memory.

In one embodiment, a program voltage signal implemented as a series of increasing program voltage pulses is applied to a set of non-volatile storage elements. Different increment values can be used when programming memory cells to different memory states. A smaller increment value can be used when programming memory cells to lower threshold voltage memory states and a larger increment value used when programming memory cells to higher threshold voltage memory states, such as the highest memory state in an implementation. When non-volatile storage elements of a set are programmed to different memory states under simultaneous application of a single program voltage signal, programming can be monitored to determine when lower state programming is complete or partially complete. The increment value can then be increased to complete programming to the highest memory state. Coarse/fine programming methodology can be incorporated for the highest memory state when the increment value is increased to maintain the threshold distribution within a reasonable range.

In accordance with one embodiment, a method for programming non-volatile storage is provided that comprises applying a program voltage signal to a set of non-volatile storage elements. A first subset of the set of non-volatile storage elements is programmed to a first target state by increasing the program voltage signal by a first increment value until each non-volatile storage element of the first subset reaches the first target state. A second subset of the set of non-volatile storage elements is programmed to a second target state. The second subset programming includes increasing the program voltage signal by the first increment value until each non-volatile storage element of the first subset reaches the first target state and then increasing the program voltage signal by a second step size when each non-volatile storage element of the first subset reaches the first target state. In one embodiment, the first subset can be part of a larger subset of non-volatile storage elements of the set that are intended for programming to the first target state. The non-volatile storage elements of the larger subset that are not successfully programmed to the first target state can be handled using error correction during read operations.

These and other objects and advantages of the present invention will appear more clearly from the following description in which the preferred embodiment of the invention has been set forth in conjunction with the drawings.

BRIEF DESCRIPTION OF THE DRAWINGS

FIG. 3A depicts a programming voltage signal that is applied to a control gate of a non-volatile storage element. FIG. 3B depicts a voltage signal applied to a bit line for a NAND string. FIG. 3C depicts the threshold voltage of the non-volatile storage element being programmed.

FIGS. 4A, 4B and 4C depict one embodiment of a programming process that is performed as part of coarse/fine programming.

FIGS. 5A, 5B and 5C depict one embodiment of a programming process that is performed as part of coarse/fine programming.

FIGS. 14A–14B are tables depicting the order of programming non-volatile memory in various embodiments.

DETAILED DESCRIPTION

Figure 1:
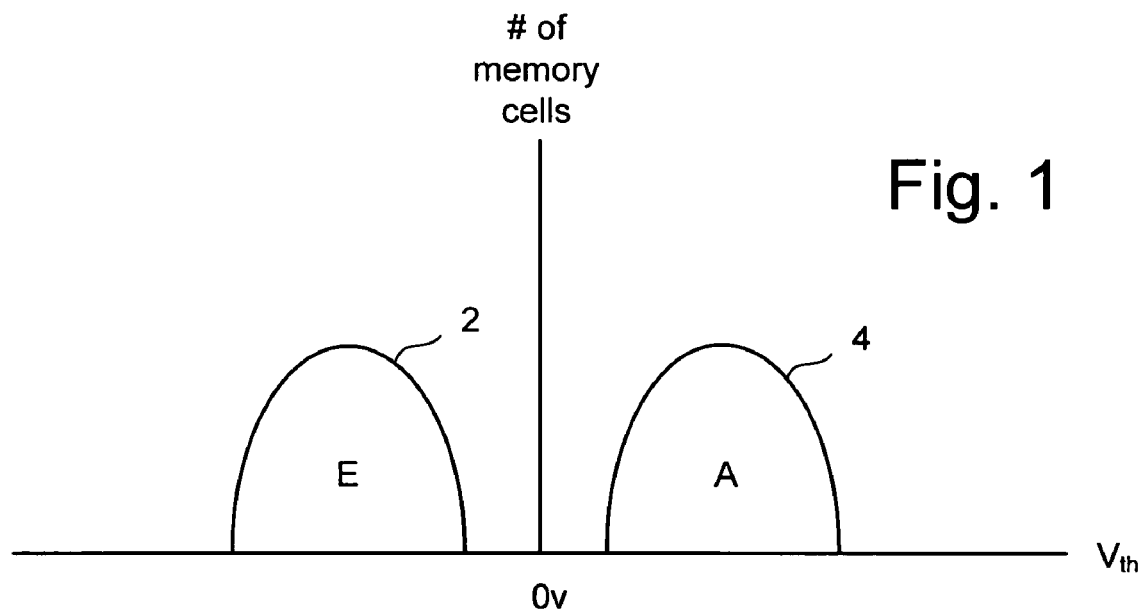
FIG. 1 is a graph depicting two threshold voltage distributions.
Figure 2:
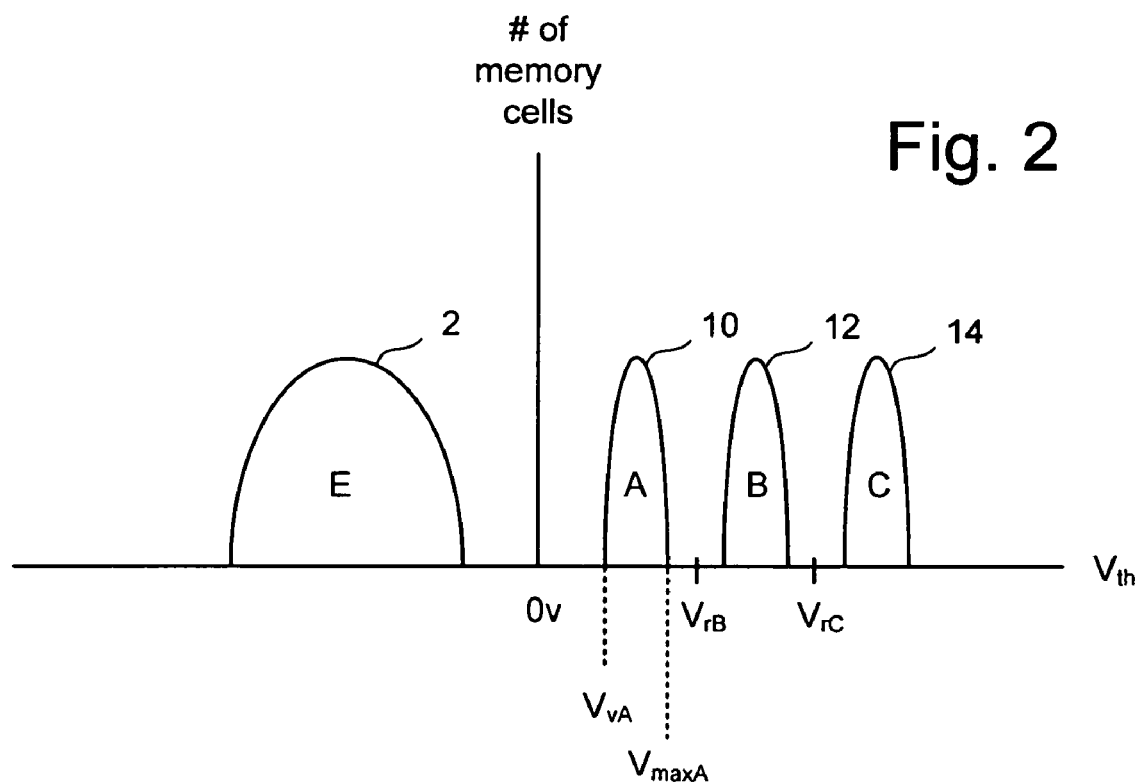
FIG. 2 is a graph depicting four threshold voltage distributions.
Figure 3C:
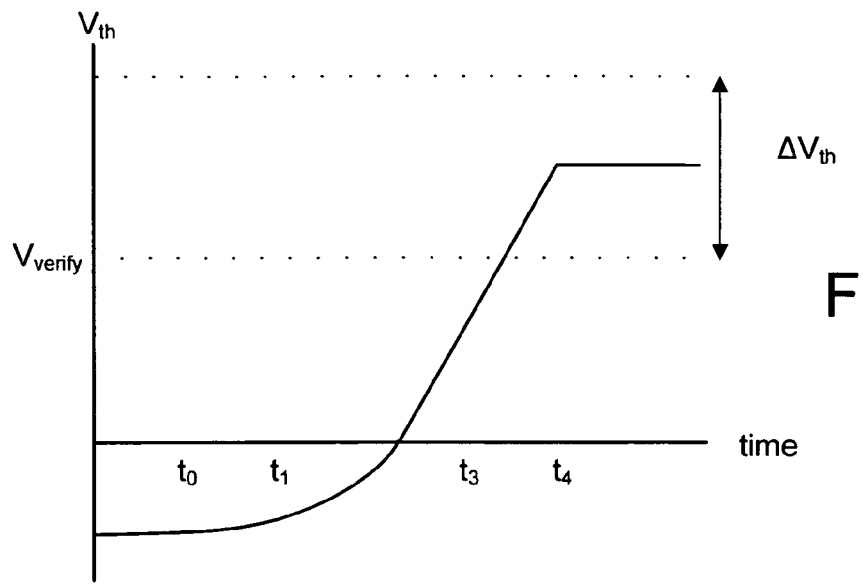
FIGS. 3A, 3B and 3C depict a programming process.
Figure 3B:
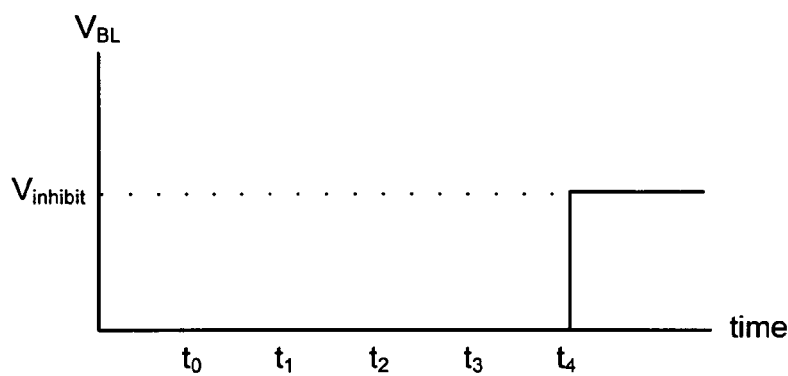
Figure 3A:
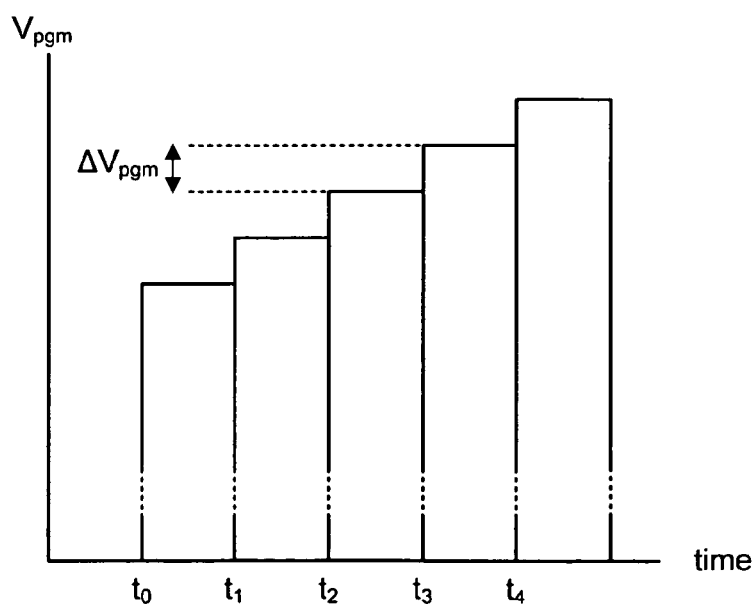
Figure 6:
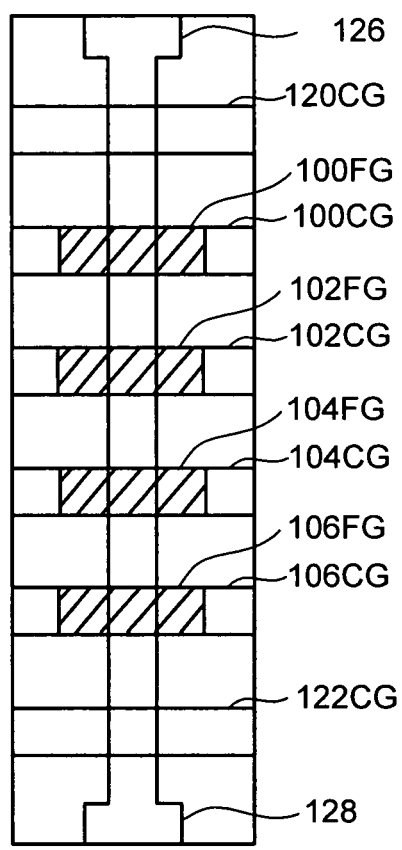
FIG. 6 is a top view of a NAND string.
Figure 7:
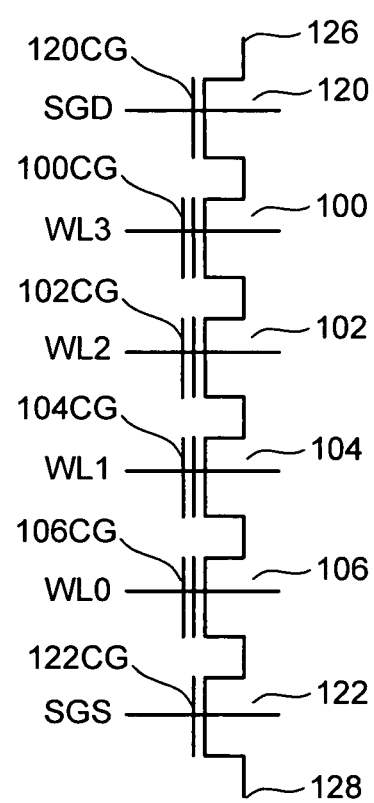
FIG. 7 is an equivalent circuit diagram of the NAND string of FIG. 6.

One example of a flash memory system suitable for implementing the present invention uses the NAND structure, which includes arranging multiple transistors in series between two select gates. The transistors in series and the select gates are referred to as a NAND string. FIG. 6 is a top view showing one NAND string. FIG. 7 is an equivalent circuit thereof. The NAND string depicted in FIGS. 5 and 6 includes four transistors 100, 102, 104 and 106 in series and sandwiched between a select gate 120 and a second select gate 122. Select gate 120 connects the NAND string to bit line contact 126. Select gate 122 connects the NAND string to source line contact 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 5 and 6. Select gate 120 is connected to select line SGD, and select gate 122 is connected to select line SGS.

Figure 8:
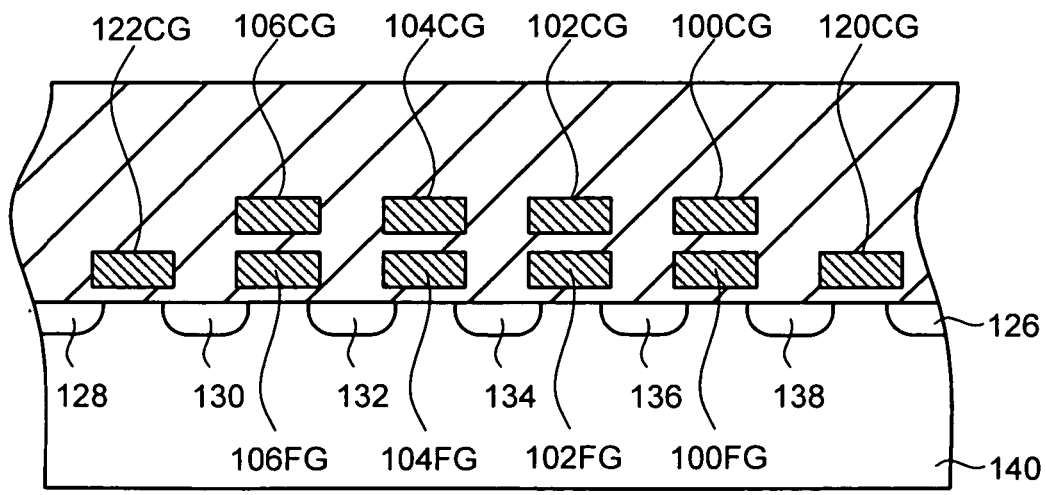
FIG. 8 is a cross sectional view of the NAND string of FIG. 6.

FIG. 8 provides a cross-sectional view of the NAND string described above. As depicted in FIG. 8, the transistors of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an inter-polysilicon dielectric layer separating the control gate and floating gate. The control gates of the memory cells (100, 102, 104, 106) form the word lines. N+ diffused layers 130, 132, 134, 136 and 138 are shared between neighboring cells, whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 6–8 show four memory cells in the NAND string, the use of four transistors is only provided as an example. A NAND string can have less than four memory cells or more than four memory cells. For example, some NAND strings will include 8 memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0V on the word line, the memory cell will turn on to indicate logic one is being stored. When the threshold voltage is positive and a read operation is attempted by applying 0V on the word line, the memory cell will not turn on, which indicates that logic zero is stored. A memory cell can also store multiple levels of information, thereby, storing multiple bits of digital data. In the case of storing multiple levels of data, the range of possible threshold voltages is divided into the number of storage levels. For example, if four levels of information are stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528 and U.S. patent application. Ser. No. 09/893,277 (Publication No. US2003/0002348). Information about programming NAND flash memory, including self boosting techniques, can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety. Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

The technology described herein is not limited to floating gate types of memory, but may also be applicable to memory cells that use other types of material for the charge storage. For example, the technology described herein can be used with memory devices that use various types of charge storage regions/layer(s) between the control gate (or word line) and the substrate, such as a nitride layer or small silicon islands, better known as nano-crystals.

Figure 9:
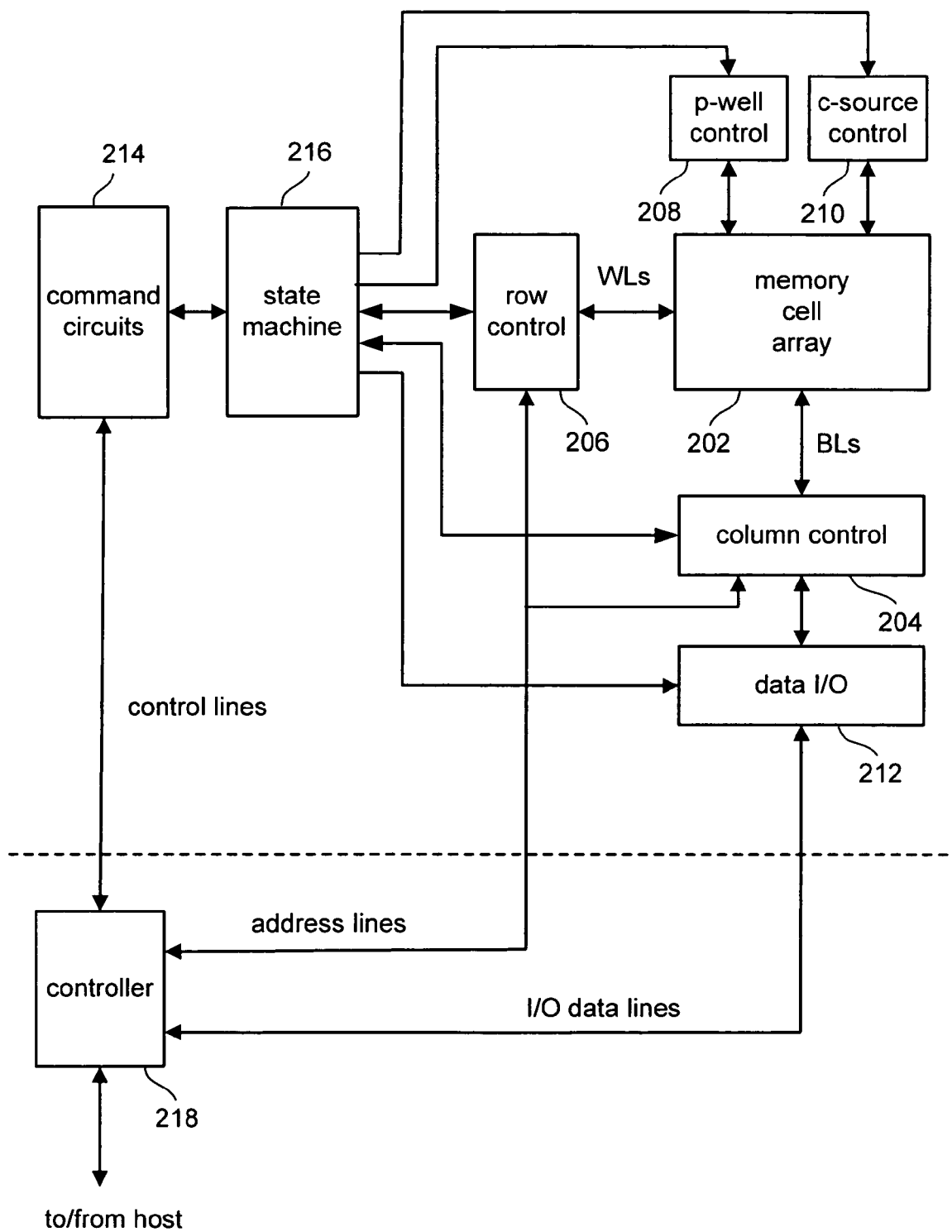
FIG. 9 is a block diagram of one embodiment of a non-volatile memory system.

FIG. 9 is a block diagram of one embodiment of a flash memory system that can be used to implement the present invention. Memory cell array 202 is controlled by column control circuit 204, row control circuit 206, c-source control circuit 210 and p-well control circuit 208. Column control circuit 204 is connected to the bit lines of memory cell array 202 for reading data stored in the memory cells, for determining a state of the memory cells during a program operation, and for controlling potential levels of the bit lines to promote the programming or to inhibit the programming. Row control circuit 206 is connected to the word lines to select one of the word lines, to apply read voltages, to apply program voltages and to apply an erase voltage. C-source control circuit 210 controls a common source line (labeled as "C-source" in FIG. 10) connected to the memory cells. P-well control circuit 208 controls the p-well voltage.

The data stored in the memory cells are read out by the column control circuit 204 and are output to external I/O lines via data input/output buffer 212. Program data to be stored in the memory cells are input to the data input/output buffer 212 via the external I/O lines, and transferred to the column control circuit 204. The external I/O lines are connected to controller 218.

Command data for controlling the flash memory device is input to controller 218. The command data informs the flash memory of what operation is requested. The input command is transferred to state machine 216, which controls column control circuit 204, row control circuit 206, c-source control 210, p-well control circuit 208 and data input/output buffer 212. State machine 216 can also output status data of the flash memory such as READY/BUSY or PASS/FAIL.

Controller 218 is connected or connectable with a host system such as a personal computer, a digital camera, personal digital assistant, etc. Controller 218 communicates with the host in order to receive commands from the host, receive data from the host, provide data to the host and provide status information to the host. Controller 218 converts commands from the host into command signals that can be interpreted and executed by command circuits 214, which is in communication with state machine 216. Controller 218 typically contains buffer memory for the user data being written to or read from the memory array.

One exemplary memory system comprises one integrated circuit that includes controller 218, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into host systems. Such a removable card may include the entire memory system (e.g. including the controller) or just the memory array(s) and associated peripheral circuits (with the Controller being embedded in the host). Thus, the controller (or control capability) can be embedded in the host or included within a removable memory system.

In some implementations, some of the components of FIG. 9 can be combined. In various designs, one or more of the components of FIG. 9, other than memory cell array 202, can be thought of as a control circuit. For example, one or more control circuits may include any one of or a combination of a command circuit, a state machine, a row control circuit, a column control circuit, a well control circuit, a source control circuit, a data I/O circuit, or a controller.

Figure 10:
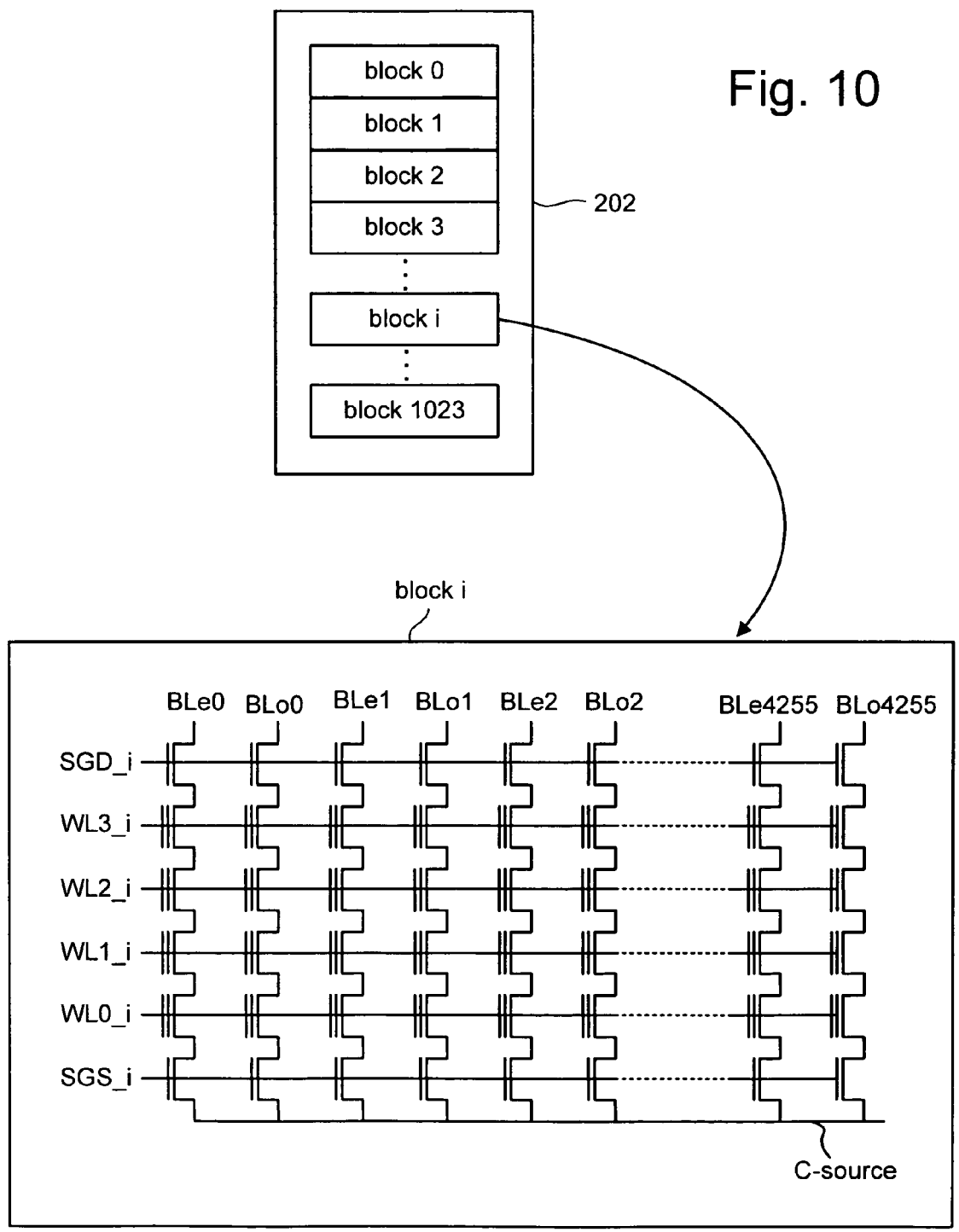
FIG. 10 illustrates an example of an organization of a memory array.

With reference to FIG. 10, an example structure of memory cell array 202 is described. As one example, a NAND flash EEPROM is described that is partitioned into 1,024 blocks. The data stored in each block is simultaneously erased. In one embodiment, the block is the minimum unit of cells that are simultaneously erased. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block of the example in FIG. 10 there are 8,512 columns that are divided into even columns and odd columns. The bit lines are also divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 10 shows four memory cells connected in series to form a NAND string. Although four cells are shown to be included in each NAND string, more or less than four memory cells can be used. One terminal of the NAND string is connected to corresponding bit line via a select transistor SGD, and another terminal is connected to c-source via a second select transistor SGS.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

During one embodiment of read and programming operations in an odd/even bit line architecture, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g., multi-state memory cells), wherein each of these two bits are stored in a different page, one block stores 16 logical pages. Other sized blocks and pages can also be used with the present invention. Additionally, architectures other than that of FIGS. 9 and 10 can also be used to implement the present invention.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

In the read and verify operations, the select gates (SGD and SGS) and the unselected word lines (e.g., WL0, WL2 and WL3) are raised to a read pass voltage (e.g. 4.5 volts) to make the transistors operate as pass gates. The selected word line (e.g. WL1) is connected to a voltage, a level of which is specified for each read and verify operation in order to determine whether a threshold voltage of the concerned memory cell is above or below such level. For example, in a read operation for a two level memory cell, the selected word line WL1 may be grounded, so that it is detected whether the threshold voltage is higher than 0V. In a verify operation for a two level memory cell, the selected word line WL1 is connected to 0.8V, for example, so that it is verified whether or not the threshold voltage has reached at least 0.8V. The source and p-well are at zero volts. The selected bit lines (BLe) are pre-charged to a level of, for example, 0.7V. If the threshold voltage is higher than the read or verify level on the word line, the potential level of the bit line (BLe) associated with the cell of interest maintains the high level because of the non-conductive memory cell. On the other hand, if the threshold voltage is lower than the read or verify level, the potential level of the concerned bit line (BLe) decreases to a low level, for example less than 0.5V, because of the conductive memory cell discharging the bitline. The state of the memory cell is thereby detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 11:
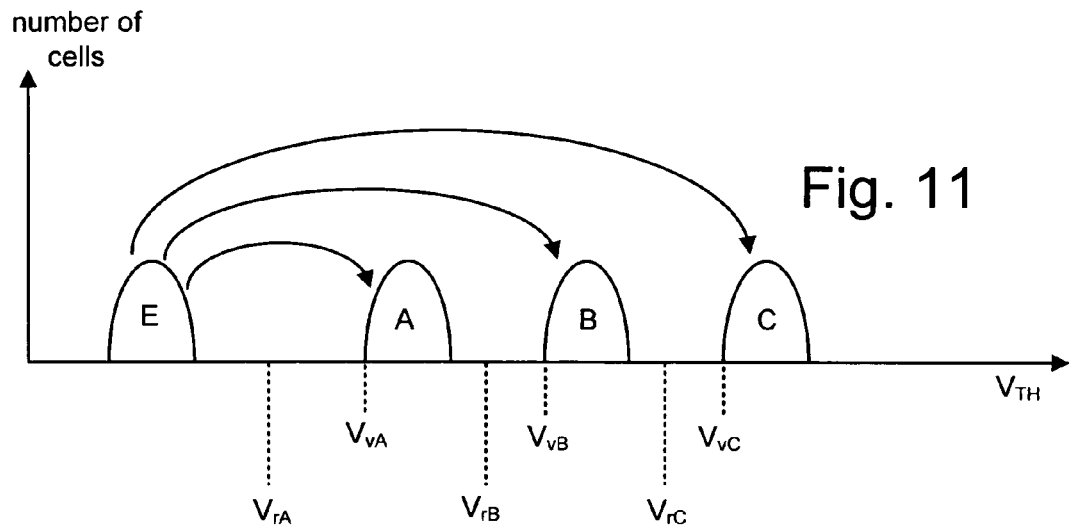
FIG. 11 depicts an exemplary set of threshold voltage distributions and a full sequence programming process.

At the end of a successful program process, the threshold voltages of the memory cells should be within one or more distributions of threshold voltages for programmed memory cells or within a distribution of threshold voltages for erased memory cells, as appropriate. FIG. 11 illustrates threshold voltage distributions for the memory cell array when each memory cell stores two bits of data. FIG. 11 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 11 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 11 shows four states, the present invention can also be used with other multi-state structures including those that include more or less than four states.

FIG. 11 also shows three read reference voltages, $V_{rA}$, $V_{rB}$ and $V_{rC}$, for reading data from memory cells. By testing whether the threshold voltage of a given memory cell is above or below $V_{rA}$, $V_{rB}$ and $V_{rC}$, the system can determine what state the memory cell is in. FIG. 11 also shows three verify reference voltages, $V_{vA}$, $V_{vB}$ and $V_{vC}$. When programming memory cells to state A, the system will test whether those memory cells have a threshold voltage greater than or equal to $V_{vA}$. When programming memory cells to state B, the system will test whether the memory cells have threshold voltages greater than or equal to $V_{vB}$. When programming memory cells to state C, the system will determine whether memory cells have their threshold voltage greater than or equal to $V_{vC}$.

FIG. 11 depicts one embodiment that utilizes full sequence programming. In full sequence programming, memory cells can be programmed from the erase state E directly to any of the programmed states A, B or C. For example, a population of memory cells to be programmed may first be erased so that all memory cells in the population are in erased state E. The process hereinafter described with respect to FIG. 15, using a series of program voltage pulses applied to the control gates of selected memory cells, will then be used to program the memory cells directly into states A, B or C. While some memory cells are being programmed from state E to state A, other memory cells are being programmed from state E to state B and/or from state E to state C.

Figure 12:
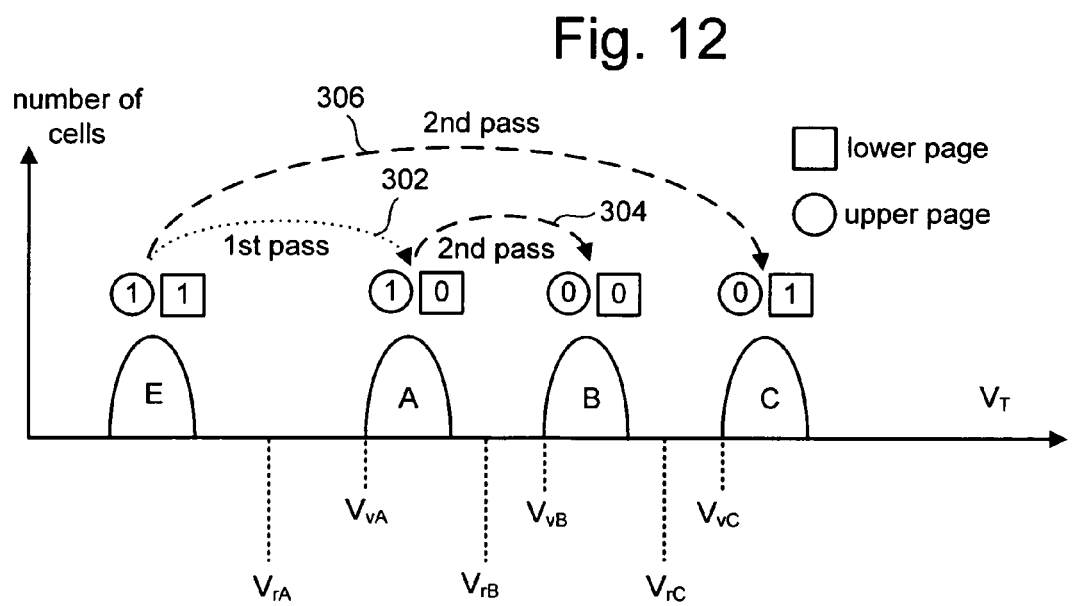
FIG. 12 depicts an exemplary set of threshold voltage distributions and a two-pass programming process.

FIG. 12 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 302. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 306. If the cell had been programmed into state A as a result of the first programming pass, then the memory cell is further programmed in the second pass so that the threshold voltage is increased to be within state B, as depicted by arrow 304. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing data using the two-pass technique and then convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Figure 13A:
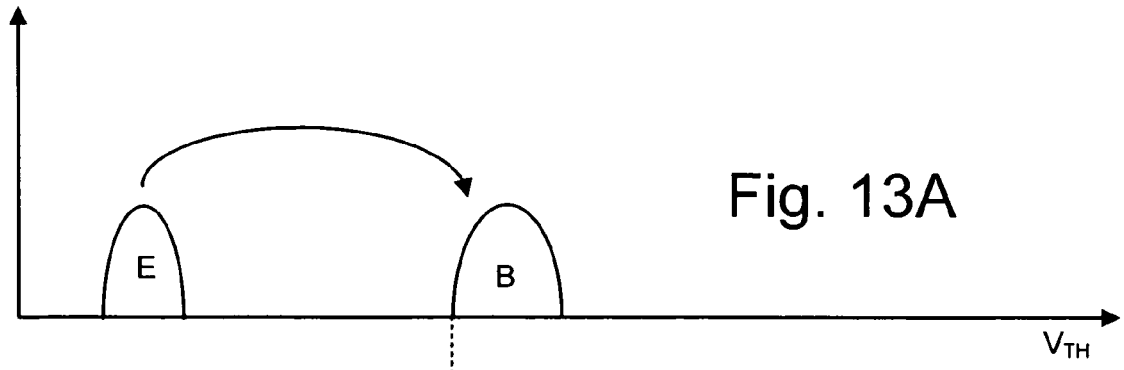
FIGS. 13A–13C depict an exemplary set of threshold voltage distributions and another two-pass programming process.
Figure 13B:
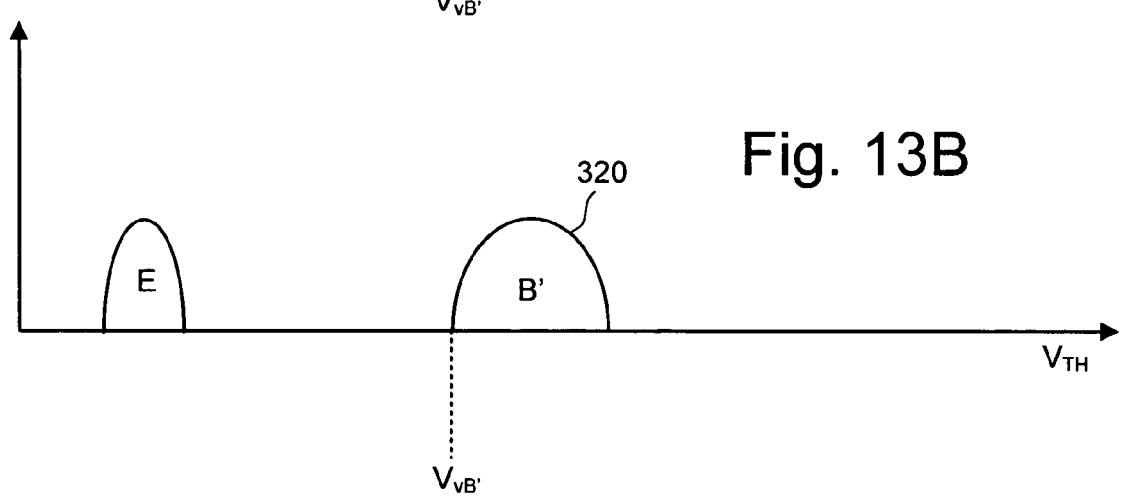
Figure 13C:
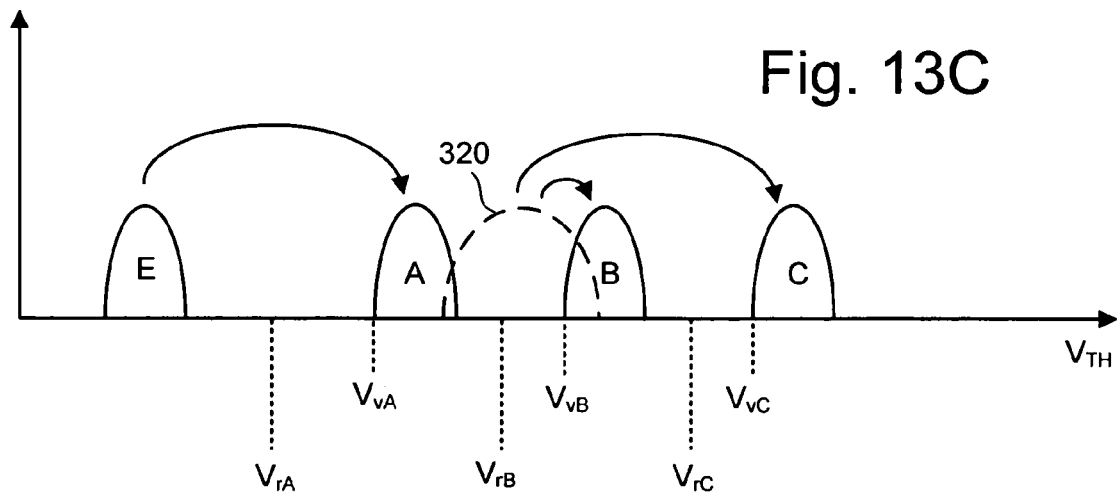

FIGS. 13A–13C disclose another process for programming non-volatile memory that reduces floating gate to floating gate coupling, for any particular memory cell, by writing to that particular memory cell with respect to a particular page subsequent to writing to adjacent memory cells for previous pages. In one example of an implementation of the process taught by FIGS. 13A–13C, the non-volatile memory cells store two bits of data per memory cell, using four data states. For example, assume that state E is the erased state and states A, B and C are the programmed states. State E stores data 11. State A stores data 01. State B stores data 10. State C stores data 00. Other encodings of data to physical data states can also be used. Each memory cell stores two pages of data. For reference purposes these pages of data will be called upper page and lower page, however, they can be given other labels. With reference to state A for the process of FIGS. 13A–13C, the upper page stores bit 0 and the lower page stores bit 1. With reference to state B, the upper page stores bit 1 and the lower page stores bit 0. With reference to state C, both pages store bit data 0. The programming process of FIGS. 13A–13C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to interim state B'. FIG. 13B shows the programming of memory cells from state E to state B'. State B' depicted in FIG. 13A is an interim state B'. Therefore, the verify point is depicted as $V_{vB}'$, which is lower than $V_{vB}$.

In one embodiment, after a memory cell is programmed from state E to state B, its neighbor memory cell in the NAND string will then be programmed with respect to its lower page. For example, looking back at FIG. 7, after the lower page for memory cell 106 is programmed, the lower page for memory cell 104 would be programmed. After programming memory cell 104, the floating gate to floating gate coupling effect will raise the apparent threshold voltage of memory cell 106 if memory cell 104 had a threshold voltage raised from state E to state B. This will have the effect of widening the threshold voltage distribution for state B to that depicted as threshold voltage distribution 320 of FIG. 13B. This apparent widening of the threshold voltage distribution will be remedied when programming the upper page.

FIG. 13C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 320 and the upper page data is to remain at 1, then the memory cell will be programmed to final state B. If the memory cell is in intermediate threshold voltage distribution 320 and the upper page data is to become data 0, then the threshold voltage of the memory cell will be raised so that the memory cell is in state C. The process depicted by FIGS. 13A–13C reduces the effect of floating gate to floating gate coupling because only the upper page programming of neighboring memory cells will have an effect on the apparent threshold voltage of a given memory cell.

Although FIGS. 13A–13C provide an example with respect to four data states and two pages of data, the concepts taught by FIGS. 13A–13C can be applied to other implementations with more or less than four states and different numbers of pages.

FIGS. 14A and 14B describe the order for programming memory cells utilizing the programming method of FIGS. 13A–13C. FIG. 14A pertains to the architecture that performs all bit line programming. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed in numerical order according to page number, from page 0 to page 7.

The table of FIG. 14B pertains to the architecture that performs odd/even programming. For memory cells on even bit lines connected to word line WL0, the lower page forms page 0 and the upper page forms page 4. For memory cells on odd bit lines connected to word line WL0, the lower page forms page 1 and the upper page forms page 5. For memory cells on even bit lines connected to word line WL1, the lower page forms page 2 and the upper page forms page 8. For the memory cells on odd bit lines connected to word line WL1, the lower page forms page 3 and the upper page forms page 9. For the memory cells on even bit lines connected to word line WL2, the lower page forms page 6 and the upper page forms page 12. For the memory cells on odd bit lines connected to word line WL2, the lower page forms page 7 and the upper page forms page 13. For the memory cells on even bit lines connected to word line WL3, the lower page forms page 10 and the upper page forms page 14. For the memory cells on odd bit lines connected to word line WL3, the lower page forms page 11 and the upper page forms page 15. Memory cells are programmed in numerical order according to page number, from page 0 to page 15. Note that in the embodiments of FIGS. 14A–14B, memory cells are programmed along a NAND string from source side to the drain side. Also, the tables depict only an embodiment with four word lines. The various methods depicted within the tables can be applied to systems with more or less than four word lines.

Various orders of programming according to various embodiments for the methods described by FIGS. 11, 12, and 13 can be performed based on the type of programming architecture used. Examples of an architecture using odd/even bit line programming can be found in U.S. Pat. Nos. 6,522,580 and 6,643,188; both of which are incorporated herein by reference in their entirety. More information about an architecture that uses all bit line programming can be found in the following U.S. patent documents incorporated by reference in their entirety: United States Patent Application Publication US 2004/0057283; United States Patent Application Publication US 2004/0060031; United States Patent Application Publication US 2004/0057285; United States Patent Application Publication US 2004/0057287; United States Patent Application Publication US 2004/0057318; United States Patent Application Publication US 2003/0161182; United States Patent Application Publication US 2004/0047182. Additionally, U.S. patent application Ser. No. 11/099,133, entitled "COMPENSATING FOR FLOATING GATE COUPLING DURING READ OPERATIONS," filed concurrently and incorporated by reference herein in its entirety, describes examples of full sequence and two-pass programming for both all bit line and odd/even programming architectures.

As described above, programming of memory cells in the memory array is accomplished by applying a program voltage $V_{pgm}$ as a series of pulses to the control gates of the memory cells. The choice of the magnitude of $V_{pgm}$ and the increment value for $\Delta V_{pgm}$ is a compromise. For example, too high of a value for $\Delta V_{pgm}$ can result in over-programming of fast memory cells, while too low of a value can result in an unreasonable reduction in programming speed.

Prior art techniques tend to apply the same increment value without regard to the memory state being programmed. In full sequence programming, memory cells are simultaneously programmed to different memory states under application of a common series of program voltage pulses. This is likewise the case in two-pass programming when simultaneously programming, for example, cells from the erased state to state C and other cells from state A to state B under application of a common program voltage. Consequently, it has been common practice in prior art techniques to utilize a single program voltage increment value irrespective of the actual memory state being programmed. As previously described, this can result in a loss of performance when looking at higher or the highest threshold voltage value memory states. For example, the highest memory state need not have as tight a threshold voltage distribution as the lower memory states for the reasons already described. Utilizing a small increment value may be necessary when programming the lower memory states in order to maintain a tight distribution. However, the use of small increment value when programming the highest memory state can result in a needless waste of valuable programming time.

In accordance with various embodiments, the shortcomings of such prior art techniques are overcome by taking advantage of the unique characteristics of the highest memory states. In one embodiment, a different increment value is used when programming memory cells to the highest memory state. For example, once it is determined that all memory cells for the lower states have been programmed to their target levels (or once almost all memory cells except for a maximum predetermined number of cells have been programmed to their target levels), the program voltage increment value can be increased to speed up programming. In a four state full sequence programming implementation for example, a larger $V_{pgm}$ increment value can be used when programming for the 2 lowest programmed states (A and B) has completed. In a four state two-pass (e.g., upper/lower page programming) programming implementation, a larger increment value can be used when programming for the second highest state (B) has completed. Many variations of these techniques exist and can be accomplished in accordance with embodiments. In some embodiments, coarse/fine programming for the highest memory state can be instigated when the larger increment value is used. This can avoid increasing the threshold voltage distribution beyond its normal range (e.g., when a small increment value is used and coarse/fine programming is not used).

Figure 15:
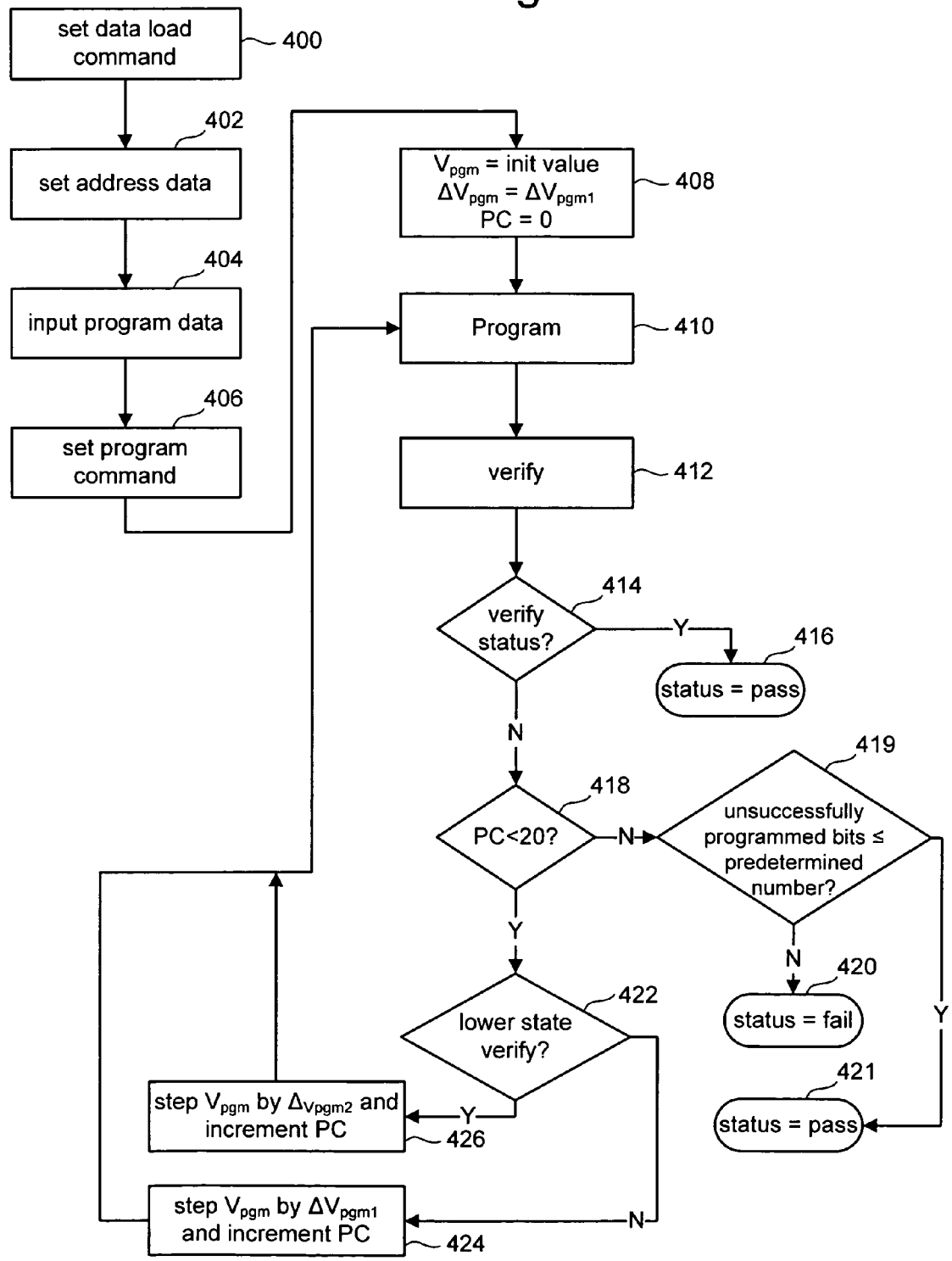
FIG. 15 is a flowchart describing one embodiment of a process for programming a page of a memory system.

FIG. 15 is a flowchart describing a method for programming a non-volatile memory system in accordance with one embodiment. As will be apparent to those of ordinary skill in the art, various steps can be modified, added, or removed depending on a specific application or implementation while still remaining within the scope and spirit of the present disclosure. In various implementations, memory cells are erased (in blocks or other units) prior to programming. At step 400 of FIG. 15 (and in reference to FIG. 9), a data load command is issued by controller 218 and input to command circuits 214, allowing data to be input to data input/output buffer 212. The input data is recognized as a command and latched by state machine 216 via a command latch signal, not illustrated, input to command circuits 214. In step 402, address data designating the page address is input to row controller 206 from controller 218. The input data is recognized as the page address and latched via state machine 216, effected by the address latch signal input to command circuits 214. At step 404, 532 bytes of program data are input to data input/output buffer 212. It should be noted that 532 bytes of program data are specific to the particular implementation described, and other implementations will require or utilize various other sizes of program data. That data can be latched in a register for the selected bit lines. In some embodiments, the data is also latched in a second register for the selected bit lines to be used for verify operations. At step 406, a program command is issued by controller 218 and input to data input/output buffer 312. The command is latched by state machine 216 via the command latch signal input to command circuits 214

Triggered by the program command, the data latched in step 404 will be programmed into the selected memory cells controlled by state machine 216. In one embodiment utilizing a full sequence programming technique, the data will be programmed into the selected memory cells using the stepped pulses of FIG. 16, hereinafter described. At step 408, $V_{pgm}$, the programming pulse voltage level applied to the selected word line, is initialized to the starting pulse (e.g. 12 volts), and a program counter PC maintained by state machine 516, is initialized at 0. Additionally, the program voltage increment value or step size $\Delta V_{pgm}$ is set to a first increment value $\Delta V_{pgm1}$.

At step 410, a program voltage ($V_{pgm}$) pulse is applied to the selected word line. The bit lines that include a memory cell to be programmed are grounded to enable programming, while the other bit lines not to be programmed are connected to Vdd to inhibit programming during application of the programming pulse.

At step 412, the states of the selected memory cells are verified. If it is detected that the target threshold voltage of a selected cell has reached the appropriate level, then the selected cell is verified as programmed to its target state. If it is detected that the threshold voltage has not reached the appropriate level, the selected cell is not verified as programmed to its target state. Those cells verified as programmed to their target state at step 412 will be excluded from further programming. At step 414, it is determined whether all cells to be programmed have been verified to have programmed to their corresponding states, such as by checking the appropriate data storage registers designed to detect and signal such a status. If so, the programming process is complete and successful because all selected memory cells were programmed and verified to their target states. A status of pass is reported in step 416.

If at step 414, it is determined that not all of the memory cells have been so verified, then the process continues at step 418. At step 418, the program counter PC is checked against a program limit value. One example of a program limit value is 20, however, other values can be used in various implementations. If the program counter PC is not less than 20, then it is determined at step 419 whether the number of bits that have not been successfully programmed is equal or less than a predetermined number. If the number of unsuccessfully programmed bits is equal to or less than the predetermined number, then the program process is flagged as passed and a status of pass is reported at step 421. If, however, the number of unsuccessfully programmed bits is higher than the predetermined number, the program process is flagged as failed and a status of fail is reported at step 420. The bits that are not successfully programmed can be corrected using error correction during the read process.

If the program counter PC is less than 20 (or any suitable value), then it is determined at step 422 whether programming of memory cells to the lower states is complete. As more fully discussed hereinafter, step 422 can include various options in accordance with embodiments depending on the type of programming architecture used. For example, in a four state full sequence programming implementation (e.g., FIG. 11), step 422 can include determining whether programming for the lower two states (A and B) is complete. In a four state two-pass programming implementation (e.g., FIG. 12) where states B and C are simultaneously programmed with a single program voltage signal, step 422 can include determining whether programming for state B is complete. In one embodiment, determining if programming is complete includes determining if all cells for the target state(s) are programmed. In another embodiment, such determining includes determining whether almost all memory cells, except for a maximum predetermined number of cells, have been programmed to their target state(s). In this later embodiment, error correction control (ECC) techniques are typically used to correct for those cells that don't get completely programmed to their target state.

If all cells (or some other number of cells being used such as all except for a maximum predetermined number) for the lower state(s) have not been verified as having reached their target level(s), the program voltage is incremented by the first increment value $\Delta V_{pgm1}$ and the program counter PC is incremented by one at step 424. If all (or almost all) cells for the lower state(s) have been verified as reaching their target level(s), the program voltage is stepped or incremented by a second increment value $\Delta V_{pgm2}$ and the program counter PC incremented by 1 at step 426. Note that in some embodiments it may be preferred to increase the program counter with a different value than 1 in order to reflect the larger step size. For example, the loop counter could be increased by a value of 2 in case the larger step size is two times larger than the smaller step size. $\Delta V_{pgm2}$ is larger than $\Delta V_{pgm1}$ to increase the speed at which the highest state is programmed. By way of non-limiting example, $\Delta V_{pgm1}$ can be 0.2V or 0.4V and $\Delta V_{pgm2}$ 0.4V or 0.8V, respectively. Such gains in programming speed will not adversely affect reliability and accurate programming since the highest state is unique in its ability to have a larger distribution of threshold voltages. The ratio of the size of $\Delta V_{pgm2}$ to $\Delta V_{pgm1}$ can vary by embodiment and types of architectures in which the included principles are incorporated. In one embodiment, a size of $\Delta V_{pgm2}$ can be selected experimentally by examining the programming characteristics of memory cells under applications of various voltages. A value can be chosen to maximize speed while also maintaining the distribution at a reasonable range. More details on the size of the various increment values are described with respect to FIGS. 16 and 17.

After step 426 or 424, the process loops back to step 410 to apply the next $V_{pgm}$ program pulse. At the end of a successful program process, the threshold voltages of the memory cells should be within one or more distributions of threshold voltages for programmed memory cells or within a distribution of threshold voltages for erased memory cells.

It should be noted that FIG. 15 describes a method of programming in a single pass technique such as when full sequence programming (e.g., FIG. 11) is used. However, extension of the embodied principles to a two-pass programming method will be apparent to those of ordinary skill in the art. For example, in a four state 2-pass programming process as illustrated by FIG. 12, a first set of iterations of steps 410–426 can be performed to program a lower page of data by moving the necessary cells from the erased state E to the first programmed state A. Because a larger increment value for $\Delta V_{pgm}$ will not be used at any point while programming the selected cells to state A, steps 422 and 426 can be omitted and $V_{pgm}$ always incremented by $\Delta V_{pgm1}$ at step 424. Once lower page programming is complete as indicated by a status of pass reported at step 416 for the lower page, a second set of iterations of steps 410–426 can be performed for upper page programming to program some cells from state A to state B and some cells from state E to state C. In the second set of iterations, steps 422 and 426 are included. Once programming to state B is complete as determined at step 422, $V_{pgm}$ will be incremented by $\Delta V_{pgm2}$ at step 426 during the remainder of iterations to complete programming to state C. The embodied principles are equally applicable to devices programmed to more than four states (e.g., 6, 8 or more states).

Figure 16:
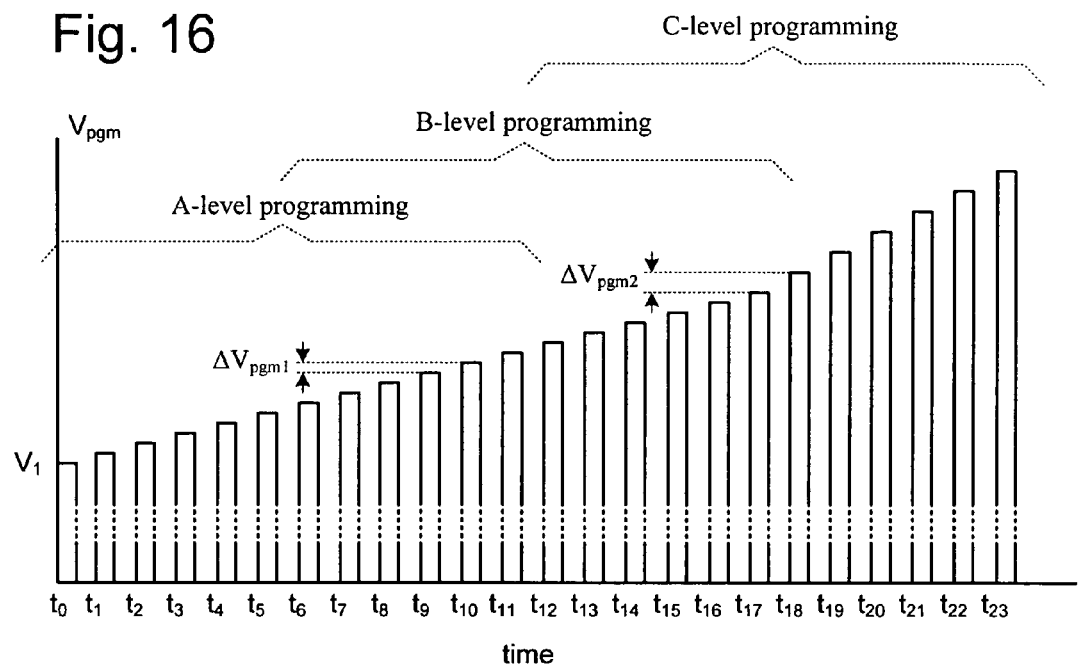
FIG. 16 depicts a program voltage signal in accordance with one embodiment.

FIG. 16 depicts a program voltage signal in accordance with one embodiment for programming different states using different program voltage step sizes. The signal of FIG. 16 is an exemplary signal only and the number of pulses required to complete various levels of programming will vary by embodiment. The program voltage sequence depicted in FIG. 16 assumes programming of a four state device using full sequence programming where each of the three programmed states are simultaneously programmed. However, the embodied principles of FIG. 16 are equally applicable to other programming methods such as two-pass programming. For example, in a four state two-pass embodiment, a first set of $V_{pgm}$ pulses are applied to program from the erased state to state A (or an interim state B as previously described). A single increment value of $\Delta V_{pgm1}$ will be used throughout the first pass. For the second pass to program select cells from state E to state C and from state A to state B, $V_{pgm}$ can be re-initialized to a starting value (optional) and the second pass programming can begin. In such an embodiment, a relevant figure such as FIG. 16 would only show B-level and C-level programming as the change in increment value would only be dependent on the completion of B-level programming. Additionally, the principles of the program voltage signal of FIG. 16 are applicable to any number of states, its extension readily apparent to those of ordinary skill in the art.

One pulse of FIG. 16 can be applied to the selected word line at step 410 of FIG. 15 during each iteration of steps 410–426. The program voltage $V_{pgm}$ is initialized to a starting value of $V_1$ (e.g., 12V) at to (step 408) and applied to the selected word line. Verification is performed between the first $V_{pgm}$ pulse at to and the second $V_{pgm}$ pulse at $t_1$. At time $t_1$, $V_{pgm}$ is incremented by a first step size $\Delta V_{pgm1}$ because all cells for states A and B have not been successfully programmed. $V_{pgm}$ is sequentially increased by $\Delta V_{pgm1}$ throughout programming of memory cells to state A for application of a higher value at step 410 during each iteration. B-level programming begins at $t_6$. It should be noted that the beginning of B-level programming indicates the time at which a first memory cell reaches state B and not the time at which the program voltage is first applied to a memory cell whose target is state B. As apparent from FIG. 15, some cells will reach state B prior to other cells reaching state A. $V_{pgm}$ continues to be incremented by $\Delta V_{pgm1}$ until all (or almost all except for a maximum predetermined number) memory cells for states A and B have reached their respective target levels. All (or almost all) memory cells for state A have reached their target level after application of the $V_{pgm}$ pulse at $t_{11}$. All (or almost all) memory cells for state B have reached their target level after application of the $V_{pgm}$ pulse at $t_{17}$. Accordingly, in the period between $t_{17}$ and $t_{18}$, it is determined (step 422) that all (or almost all) memory cells for states A and B have been successfully programmed. The program voltage increment value is then changed to $\Delta V_{pgm2}$ and the program voltage increased by that amount prior to application of the $V_{pgm}$ pulse at time $t_{18}$. $V_{pgm}$ continues to be incremented by $\Delta V_{pgm2}$ until all (or almost all) cells for state C reach their target level at $t_{23}$. Note that in some embodiments, the time that is needed to detect whether all (or almost all) cells in states A and B have successfully been programmed may be longer than the time available between two programming pulses, In such a case, the programming with increased step size may start later, for example, one pulse later than in the above example.

By using a larger $\Delta V_{pgm2}$, programming speed increases when programming of states A and B is complete. This can increase overall programming times while maintaining narrow threshold voltage distributions for the lower states and not adversely effecting device performance due to the unique characteristics of the highest memory state.

Figure 17:
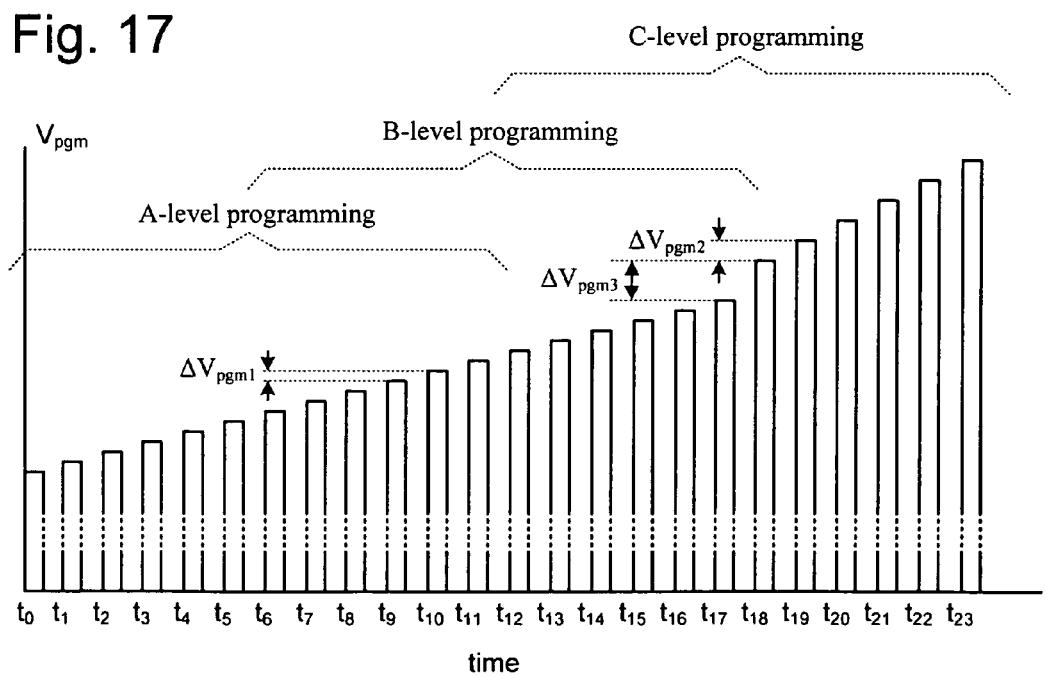
FIG. 17 depicts a program voltage signal in accordance with one embodiment.

FIG. 17 depicts a program voltage signal in accordance with another embodiment. Again, FIG. 16 assumes full sequence programming of a four state device, but the principles are equally applicably to devices with more than four states as well as other programming architectures such as multiple pass programming techniques. In FIG. 17, a third program voltage step size $\Delta V_{pgm3}$ is used for the first pulse after verifying that all cells for states A and B have been successfully programmed.

Some non-volatile storage elements may initially program slowly (have charged slowly injected into the floating gate) and nonlinearly under application of a steadily increasing program voltage. After application of a few pulses, the memory cells tend to settle to a substantially linear increase in stored charge as the applied program voltage pulses are steadily increased. In addition to occurring at the start of a programming cycle, this phenomenon can occur when switching the size of the program voltage step size. To minimize any delay in the increase in programming speed that results from a larger program voltage step size, one or more larger increases than $\Delta V_{pgm2}$ can be applied prior to increasing the program voltage by $\Delta V_{pgm2}$. In this manner, an immediate increase in the amount of charge transferred to the floating gate of the device under application of a single pulse can be achieved. Such techniques can further decrease programming times by minimizing or eliminating any time in which the stored charge does not substantially increase because of a change in program voltage step size.

In FIG. 17, programming of cells for states A and B is again completed after application of the $V_{pgm}$ pulse at $t_{17}$. $V_{pgm}$ is incremented by $\Delta V_{pgm3}$ at $t_{18}$. After increasing $V_{pgm}$ by $\Delta V_{pgm3}$, $V_{pgm}$ is increased by $\Delta V_{pgm2}$ for the remaining pulses until all cells for state C have been successfully programmed. In one embodiment, $\Delta V_{pgm3}$ is larger than $\Delta V_{pgm2}$, although embodiments can use a $\Delta V_{pgm3}$ that is less than $\Delta V_{pgm2}$ as well. In one embodiment, $\Delta V_{pgm3} = 2 \cdot \Delta V_{pgm2}$. By way of non-limiting example, $\Delta V_{pgm1}$ can be 0.2V, $\Delta V_{pgm2}$ 0.4V, and $\Delta V_{pgm3}$ 0.8V. The value of $\Delta V_{pgm3}$ can vary by embodiment and implementation in order to achieve a desired programming speed. By employing a $\Delta V_{pgm3}$ that is larger than $\Delta V_{pgm2}$, a faster increase in programming speed can be achieved when the program voltage increment value is increased.

Figure 18A:
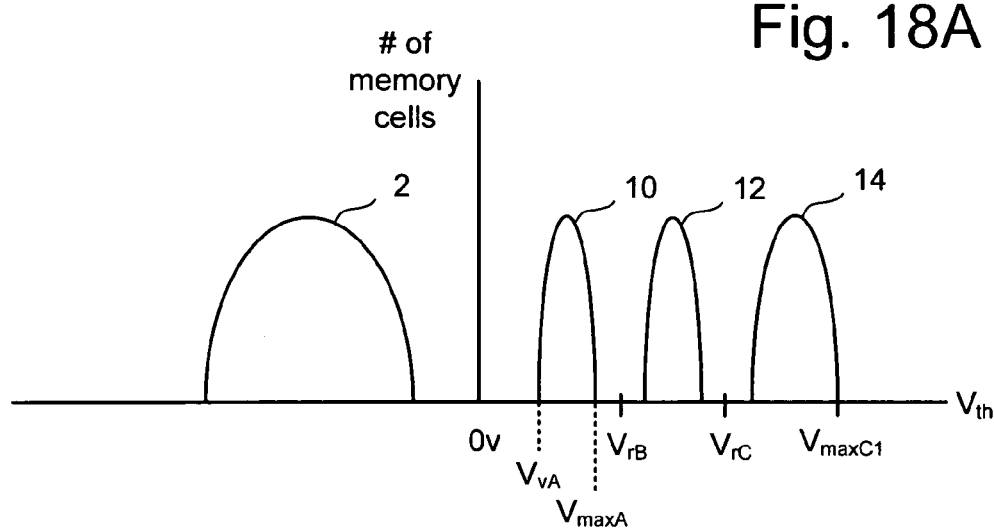
FIGS. 18A–18C depict an exemplary set of threshold distributions in accordance with one embodiment.
Figure 18B:
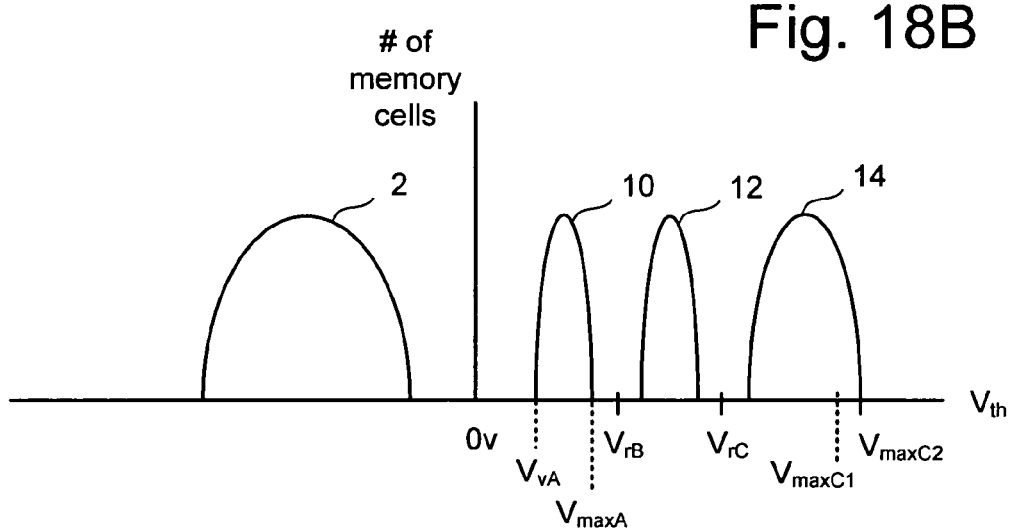
Figure 18C:
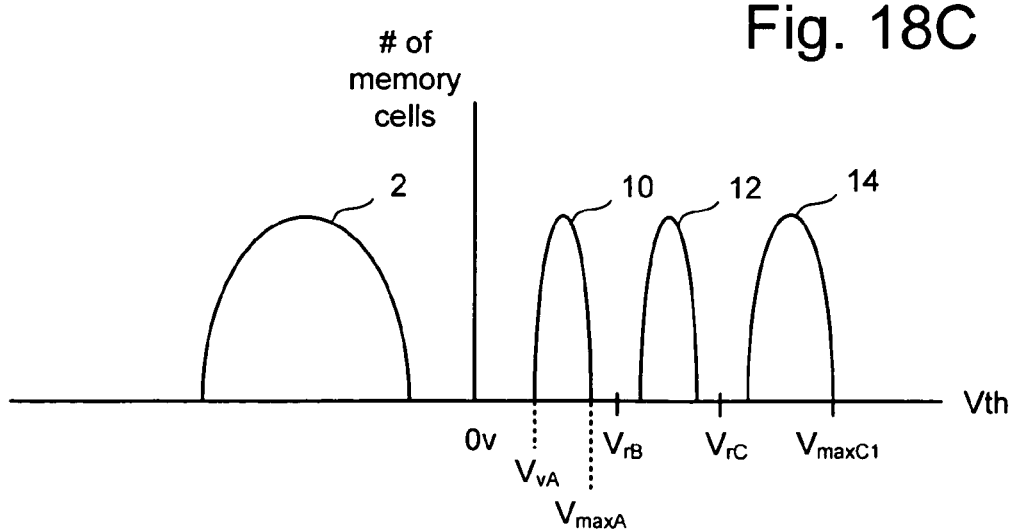

Incorporation of varying program voltage step sizes can be combined with coarse/fine programming methodology to provide further benefits when programming. FIGS. 18A–18C illustrate the threshold voltage distributions for populations of memory cells programmed to four states. In FIG. 18A, states A, B, and C are all programmed using the same $V_{pgm}$ step size. A coarse/fine programming methodology is used when programming states A and B but not when programming C. The distributions for cells in states A and B are narrower than that for cells in state C because of the use of coarse/fine programming. The coarse/fine programming effectively decreases the distributions for these states because of a more controlled and precise programming process. For reference purposes, the highest threshold voltage of any memory cell within the state C distribution is denoted as $V_{maxC1}$.

In FIG. 18B, the various states are programmed in accordance with one embodiment using a larger $V_{pgm}$ step size when programming cells to state C (after programming of states A and B is complete). Again, cells for states A and B are programmed using coarse/fine programming while cells for state C are not. Because a larger step size is used when programming state C, the threshold voltage distribution for those cells is increased beyond the state C distribution of FIG. 18A. The highest threshold voltage of any memory cell in state C for FIG. 18B is denoted as $V_{maxC2}$. As can be seen, the highest threshold voltage for state C in FIG. 18B is larger than the highest threshold voltage for state C in FIG. 18A. In many implementations this may be acceptable. A larger distribution for the highest state will not effect (or significantly effect) device performance because no differentiation is necessary between the state and a higher state. However, a too high threshold voltage for the C-state will result in reduced read currents in the NAND string. This may result in a NAND string current that is too low to be able to read the selected memory cell correctly.

In some embodiments, however, it may be desirable to limit the threshold voltage distribution for state C, while also using a larger step size to decrease programming times. Accordingly, coarse/fine programming techniques can be utilized with an increased program voltage step size for the highest programmed state to offset some or all of the increased threshold voltage distribution that results from a larger program voltage step size. FIG. 18C illustrates resulting threshold voltage distributions when state C is programmed with a larger program voltage step size and with coarse/fine programming. As depicted, the resulting distributions are substantially similar to those of FIG. 18A, where neither coarse/fine programming nor a larger step size is used for state C. The highest threshold voltage of any memory cell programmed to state C in FIG. 18C is the same as that of FIG. 18A. The increase in the state C distribution attributable to the utilization of a larger step size is offset by using coarse/fine programming.

In various embodiments, coarse/fine programming of the highest memory state can begin at various times. In one embodiment for example, coarse/fine programming for cells being programmed to the highest state can be performed throughout programming. In other embodiments, coarse/fine programming can begin at the same time the step size is increased—when all (or almost all) cells for the lower state levels have successfully been programmed.

Figure 19:
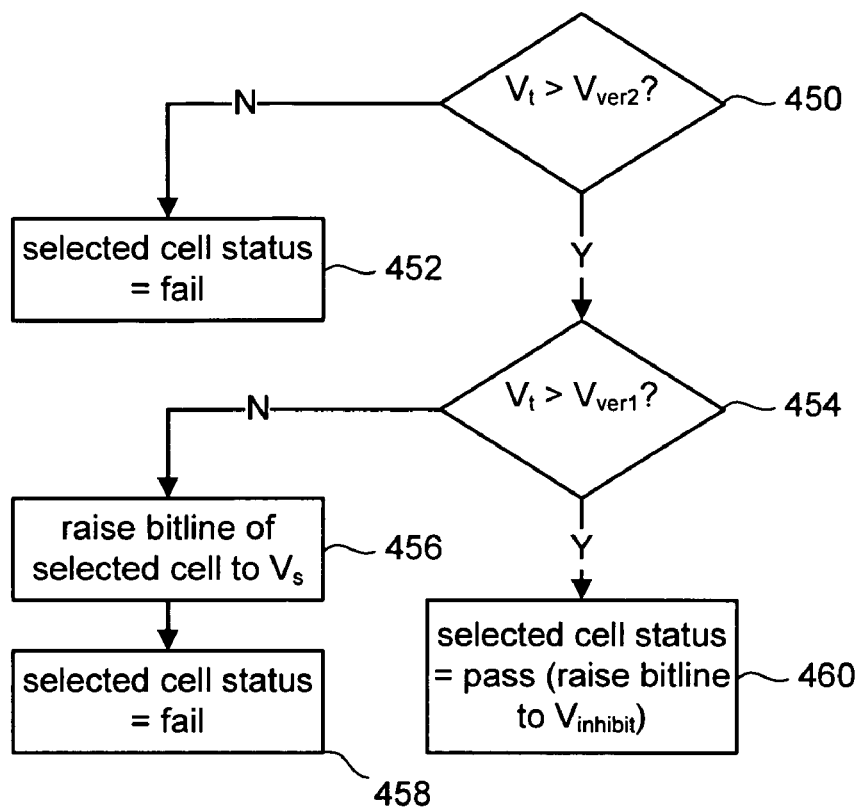
FIG. 19 is a flowchart describing a coarse/fine programming process in accordance with one embodiment.

FIG. 19 is a flowchart in accordance with one embodiment where coarse/fine programming begins at the completion of lower state programming. FIG. 19 can be performed as part of verify step 412 of FIG. 15. FIG. 19 depicts the process for verifying an individual memory cell. It will be appreciated that multiple memory cells may be verified in parallel according to the method of FIG. 19. After applying a program voltage at step 410 of FIG. 15, the memory cell's threshold voltage is verified at step 450 against a first threshold voltage level $V_{ver2}$ (e.g., $V_{vA1}$), which is the lower verify level (coarse/fine programming level) used to instigate a transition from coarse programming to fine programming. If the memory cell's threshold voltage is less than verify level $V_{ver2}$, the selected memory cell's program status is set to fail at step 452. If however, the memory cell's threshold voltage is above $V_{ver2}$, it is determined at step 454 whether the cell's threshold voltage is above the final verify level $V_{ver1}$ (e.g., $V_{vA}$) for the target state. If the threshold voltage is above $V_{ver1}$, the selected cell's status is set to pass at step 460. An appropriate response may be taken such as raising the bitline of the selected cell to $V_{inhibit}$ to inhibit programming of the cell during application of additional program voltage pulses. If the memory cell's threshold voltage is above $V_{ver2}$ but not $V_{ver1}$, the cell is placed into fine programming mode by raising the bitline of that cell to $V_S$ at step 456. As previously described, $V_S$ is lower than $V_{inhibit}$ and will slow programming of the cell by decreasing the potential across the channel of the cell during application of additional program pulse(s). At step 458, the selected cell's status is set to fail. It will be appreciated that various steps of FIG. 19 can be performed at other times than during verification at step 412 of FIG. 15. For example, the bitline of a selected cell can be raised to $V_{inhibit}$ or $V_S$ just prior to applying a program pulse at step 410 of FIG. 15.

In one embodiment, a modified form of the coarse/fine programming methodology heretofore described can be used. In the modified form, a lower voltage ($V_S$) to slow down programming than is normally used for coarse/fine programming can be applied to the bitline when the selected memory cell crosses the verify level ($V_{ver2}$) to transition from coarse to fine programming. In one embodiment, the voltage $V_S$ in the modified form is chosen such that the threshold voltage shift of the cell after application of the next pulse is equal (or almost equal) to $\Delta V_{pgm2}/2$. By choosing such an arrangement, it can be substantially guaranteed that the threshold voltage will pass the final verification level ($V_{ver1}$) after application of the next program voltage pulse. In this modified coarse/fine programming technique, only one additional pulse will be applied to the selected memory cell after it is verified as reaching $V_{ver2}$, irrespective of whether the memory cell's threshold voltage after the one additional pulse is higher or lower than the final verify level $V_{ver1}$. This modified technique has the advantage of fewer programming pulses being applied to the selected memory cell. This not only results in a shorter programming time, but also causes less program disturb, especially when used for the highest programmed memory state.

Embodiments incorporating multiple program voltage step sizes and/or coarse/fine programming for the highest state level can be combined with other techniques to further improve program efficiency and/or reliability. FIGS. 20–23 illustrate embodiments in which a programming process for a page or other unit of data further incorporates techniques to detect faster programming cells and adjust the program step size to avoid overprogramming these cells while also maintaining reasonable programming times.

As described above, programming of the memory cells in the memory array is accomplished by applying a program voltage $V_{pgm}$ as a series of pulses to the control gates of the memory cells. The choice of the magnitude of $V_{pgm}$ is a compromise. Too high of a value will result in more fast cells being over-programmed, while a too low of a value will result in an unreasonable reduction in the programming speed. The number of fast cells that may cause over-programming is relatively small in comparison to the total number of memory cells in a memory system. As a result, when a page of memory cells is programmed, the probability that there will be one or more fast memory cells in such a page is not very high. This would mean that if a low $V_{pgm}$ is used to avoid over-programming, most pages would unnecessarily suffer in terms of programming speed since the number of required programming pulses is mainly determined by the start value of $V_{pgm}$. In reality, only a small number of the total pages in a memory system need a low $V_{pgm}$ value, while other pages could be programmed with a higher $V_{pgm}$ to avoid degradation in performance. To solve this dilemma, the following process is proposed.

First, a low initial value for $V_{pgm}$ is used for the first programming pulse such that no memory cells (or only a small number of memory cells) will be over-programmed during the first programming pulse (or first two or three pulses). To reduce the impact on programming time for pages with no fast memory cells, the subsequent programming pulses will be increased in magnitude with a larger step size (e.g., 0.6 v, instead of a typical value of 0.3 v). The value of $V_{pgm}$ will be quickly increased by the larger step size until the first set of one or more cells (or other minimum number) have reached an initial verify level ($V_{vstart}$). Thus, not much time is lost and the total number of programming pulses may be similar or even less than other systems.

In the case where one or more fast memory cells are present in a page being programmed, then these fast memory cells would be detected after the first pulse. However, depending on what value for $V_{pgm}$ is used, more than one program pulse may be needed before any fast cells are detected. In some pages, a fast cell or cells may be detected after the first pulse. In other pages a fast cell or cells may be detected after two or more pulses, while in other pages, no fast cells may be detected at all. Subsequent programming pulses will be increased with a smaller step size in order to avoid over-programming of those fast memory cells. Such a page with fast memory cells would need a large number of programming pulses since the step size is small from the beginning. Since a majority of the pages in the memory array will not have any fast cells and, therefore, will not be slowed down too much, the overall programming speed will not unreasonably suffer. Only for pages where it is needed, the programming will be slower to avoid over-programming.

Figure 20:
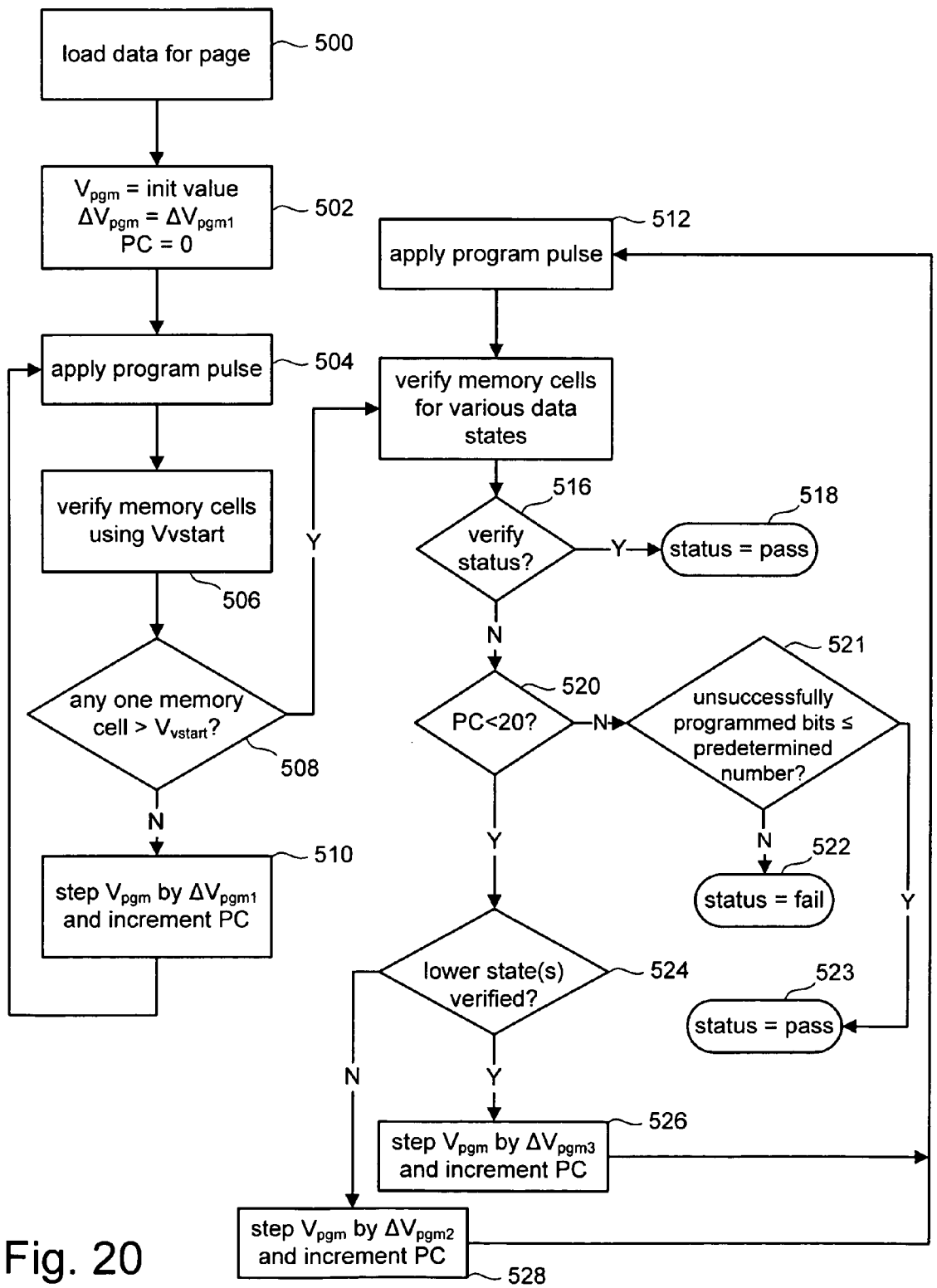
FIG. 20 is a flowchart describing one embodiment of a process for programming a page of a memory system.

FIG. 20 is a flowchart describing one embodiment for programming a page of data where the program step size is adjusted for faster programming cells. FIG. 20 also incorporates the techniques for programming the highest memory state as described above.

In step 500, data is loaded for the particular page being programmed. In step 502, the program voltage $V_{pgm}$ is set to its initial low value, the increment value $\Delta V_{pgm}$ is set to a first increment value $\Delta V_{pgm1}$ and the program counter PC is initialized to zero. The value of the first program pulse is set with a magnitude low enough so that none or only a sufficiently small number of the non-volatile storage elements (even fast non-volatile storage elements) being programmed will be over-programmed (e.g., 15V). In step 504, the first program pulse is applied. Because the magnitude is set low enough, none or only a sufficiently small number of the memory cells should become over-programmed after the first programming pulse. As discussed above, in one embodiment, the memory cells in a page of data share a common word line and, thus, receive the same programming pulses at their respective control gates. After the program pulse, the memory cells are then verified against a voltage $V_{vstart}$ in step 506. The voltage value $V_{vstart}$ is used to determine which memory cells are fast memory cells. It is chosen by device characterization so that any cells that pass $V_{vstart}$ after one programming pulse are considered fast memory cells. If none of the memory cells for the particular page being programmed have a threshold voltage greater than $V_{vstart}$ (step 508), then in step 510 the program voltage is incremented by $\Delta V_{pgm1}$ and the program counter PC is incremented by 1. Note that in some embodiments it may be preferred to increase the program counter with a different value than 1 in order to reflect the larger step size. For example, the program counter could be increased by a value of 2 in case the larger step size is two times larger than the smaller step size. After step 510, the process loops back to step 504 and the next program pulse is applied. Steps 504–508 will be iterated until at least one memory cell has a threshold voltage greater than $V_{vstart}$.

Note that in one embodiment, step 508 will use a different minimum number (other than one memory cell) to test whether there are a sufficient number of memory cells with a threshold voltage greater than $V_{vstart}$. The number used varies by implementation.

When, in step 508, it is determined that one or more memory cells (or a different minimum number) have a threshold voltage greater than $V_{vstart}$, then the process continues at step 514, at which time all of the memory cells are verified against the various verify levels for the different program states. In one embodiment, the iterations of step 504–510 include only verifying the memory cells against $V_{vstart}$ in order to find one or more (or another minimum number) of memory cells that have a threshold voltage greater than $V_{vstart}$. After one or more memory cells are found to have a threshold voltage greater than $V_{vstart}$, all memory cells are verified against the various targets (or targets and coarse/fine verify levels, as appropriate by the implementation). For example, if coarse/fine programming is used, each memory cell will be verified against a coarse/fine verify level and a final target verify level for each of the various program states (step 514).

Note that different types of coarse/fine programming can be implemented, it is for example possible to verify first only against a coarse level of a certain desired state and start verifying against a fine level after the first cell has passed the coarse level of that state. Furthermore, if multiple levels are programmed at the same time, coarse/fine programming for the higher levels can be postponed for a certain number of programming pulses. Another possibility is to start coarse verifying for the higher levels a certain number of pulses after coarse verifying of a lower state has detected one or more cells passing that lower state coarse level. Using the above methods, the total number of required verify operations can be minimized, thereby reducing the total required programming time. U.S. patent application Ser. No. 10/314,055 entitled, "Smart Verify For Multi-State Memories," filed Dec. 5, 2002, describes various techniques for efficient verification as described above.

If all of the memory cells are verified to have reached their intended target level (step 516), then the process is complete and status is set to pass (step 518). In some embodiments, the programming process can complete successfully if less than all memory cells reach their intended target. For example, in some embodiments if almost all memory cells reach their intended target (e.g., with no more than a predetermined number of cells not reaching their target), the process is successful. Memory cells that have not reached their target can be taken care of when reading using error correction or the data can be programmed elsewhere in the memory array in case too many cells have failed to reach their target. If not all of the memory cells verify (which is likely the first time step 514 is performed), then it is determined whether the program counter is less than 20 (or another suitable value) at step 520. If the program counter is at 20 (or any other suitable value) or greater, then the process continues at step 521 where it is determined if the number of unsuccessfully programmed bits is less than or equal to a predetermined number. If the number of unsuccessfully programmed bits is less than or equal to the predetermined number, the program process is flagged as passed and a status of pass is reported at step 523. If however, the number of unsuccessfully programmed bits is higher than the predetermined number, the program process is flagged as failed and a status of fail is reported at step 522. The bits that are not successfully programmed can be corrected using error correction during the read process. If the program counter is still less than 20 (or any other suitable value), it is determined whether all cells (or in some embodiments, almost all cells of a predetermined number) for the lower states have reached their target level (step 524). Step 524 can include various determinations in accordance with different embodiments. For example, if full sequence programming of four state devices is being performed, step 524 can include determining whether all cells for the lowest two programmed states (e.g., states A and B) have reached their target levels. If a multiple pass programming process for a four state memory is being performed whereby a lower page (and consequently state A) is programmed in a first pass, a first set of iterations of steps 512–528 can be performed for a first pass and a second set of iterations performed for a second pass. In such a scenario, steps 524 and 526 need only be performed during the second pass to determine whether all cells for state B have been programmed to their target levels. During the first pass iterations, $V_{pgm}$ will be increased by $\Delta V_{pgm2}$ until all (or almost all) cells reach state A or a failure determination is made at step 522.

If all of the lower states have not been programmed, $V_{pgm}$ is incremented by $\Delta V_{pgm2}$ and the program counter PC incremented by 1 at step 528. If all lower states have been programmed, $V_{pgm}$ is incremented by $\Delta V_{pgm3}$ and the program counter incremented by 1 at step 526. Note that in some embodiments it may be preferred to increase the program counter with a different value than 1 in order to reflect the larger step size. For example, the loop counter could be increased by a value of 2 in case the larger step size is two times larger than the smaller step size. The process loops from step 526 or 528 to step 512 where the increased program voltage pulse is applied to the selected word line. Note that $\Delta V_{pgm2}$ is a smaller step size than $\Delta V_{pgm1}$. Thus, the program voltage $V_{pgm}$ increases much faster during the iterations of step 504–510, as compared to the slower rising of the program voltage $V_{pgm}$ during the iterations of step 512–528 when increment value $\Delta V_{pgm2}$ is used. $\Delta V_{pgm3}$ is a larger step size than $\Delta V_{pgm2}$ as in the embodiments previously discussed for using a larger step size for programming higher states. In one embodiment, $\Delta V_{pgm3}$ can be the same size as $\Delta V_{pgm1}$ to revert programming back to the initial speed during the iterations of steps 504–510. In other embodiments, $\Delta V_{pgm3}$ is less than or greater than $\Delta V_{pgm1}$. Various sizes can be chosen for $\Delta V_{pgm3}$ in relation to $\Delta V_{pgm1}$ to achieve a desired increased programming rate when programming the highest level state. In other embodiments, coarse/fine programming techniques as described with respect to FIG. 19 can additionally be incorporated into the method of FIG. 20.

Figure 21A:
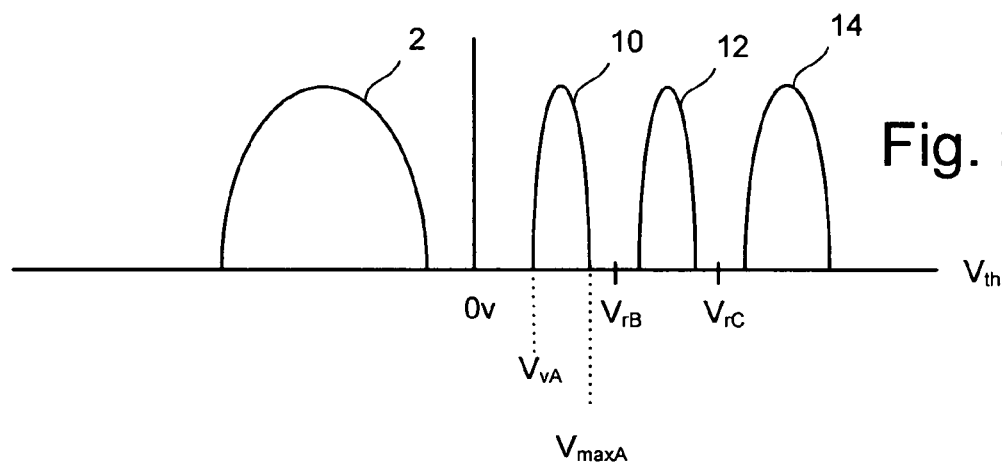
FIGS. 21A–21C depict threshold voltage distributions.
Figure 21B:
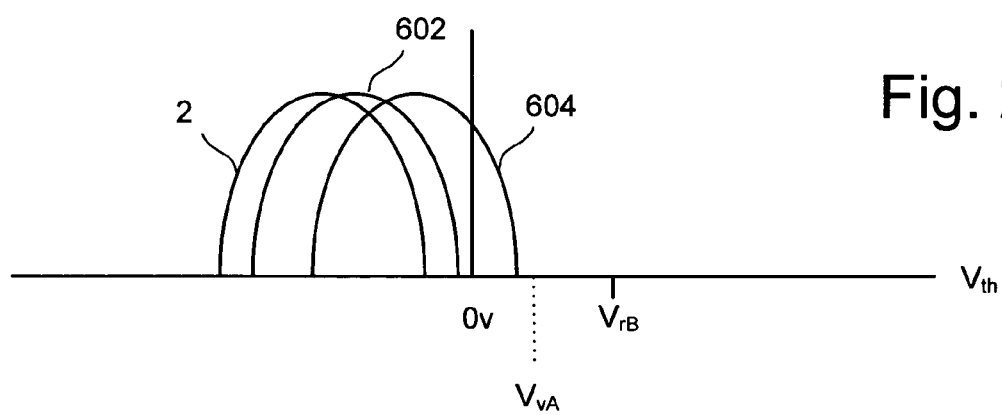
Figure 21C:
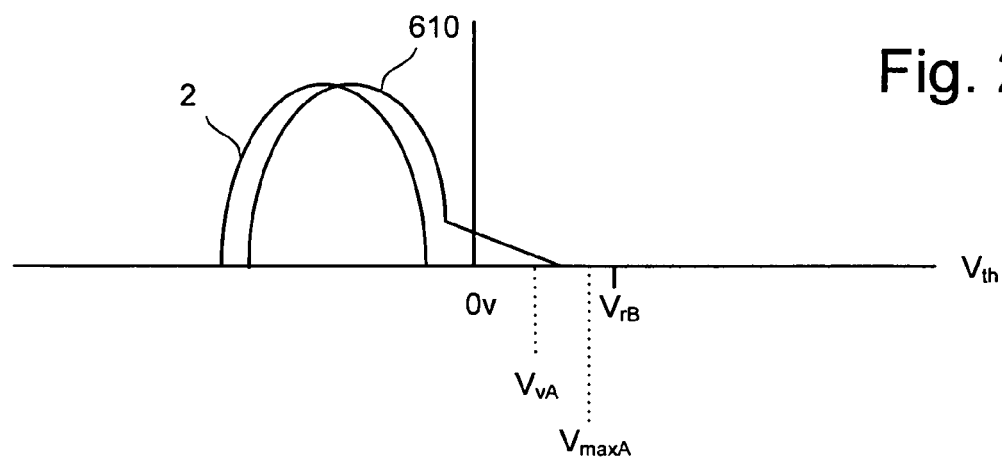

The behaviors of memory cells programmed according to methods incorporating the techniques described with respect to FIG. 20 are described with respect to FIGS. 21A, 21B, and 21C. FIG. 21A shows the threshold voltage distributions 2, 10, 12, and 14 for two bit multi-state cells. Note, however, the technology described herein applies to memory cells storing more and less than two bits of data as well. Also depicted in FIG. 21A are read verify points $V_{rB}$ and $V_{rC}$. Read verify point $V_{rB}$ is for distinguishing between threshold voltage distributions 10 and 12. Read verify point $V_{rC}$ is for distinguishing between threshold voltage distributions 12 and 14. Zero volts can be used to distinguish between threshold voltage distributions 2 and 10. FIG. 21A also shows voltage level $V_{vA}$ as the lowest voltage of threshold voltage distribution 10 and $V_{maxA}$ as the upper voltage limit of voltage distribution 10.

FIG. 21B shows erased threshold voltage distribution 2 and programmed threshold voltage distributions 602 and 604 when no fast memory cells are present in the page. In this case, verify level $V_{vA}$ represents the final target verify level and zero volts can be used as $V_{vstart}$. It can been seen that the threshold voltage distribution 602 after the first pulse shifts up from the erased level to a certain extent. However, none of the memory cells have reached $V_{vstart}$ (0 v) yet, so programming continues with a second pulse that has a $V_{pgm}$ increased by the increment $\Delta V_{pgm1}$. As a result, the threshold voltage distribution shifts up with a value close to $\Delta V_{pgm1}$. Note that this amount of shift may vary and strongly depends on the amplitude of the initial $V_{pgm}$ pulse. After the second pulse, a number of memory cells in distribution 604 have reached a threshold voltage above $V_{vstart}$ (0 volts). Thus, $V_{pgm}$ will be subsequently increased with the smaller step size $\Delta V_{pgm2}$.

FIG. 21C shows erased threshold voltage distribution 2 and programmed threshold voltage distribution 610 when fast memory cells are present. After the first programming pulse (e.g., threshold voltage distribution 610) a number of cells have a threshold voltage greater than the $V_{vstart}$ (0 volts). Some memory cells may have a threshold voltage greater than $V_{vA}$. Thus, the step size for the following programming pulse will be equal to $\Delta V_{pgm2}$ to avoid overprogramming.

Figure 22C:
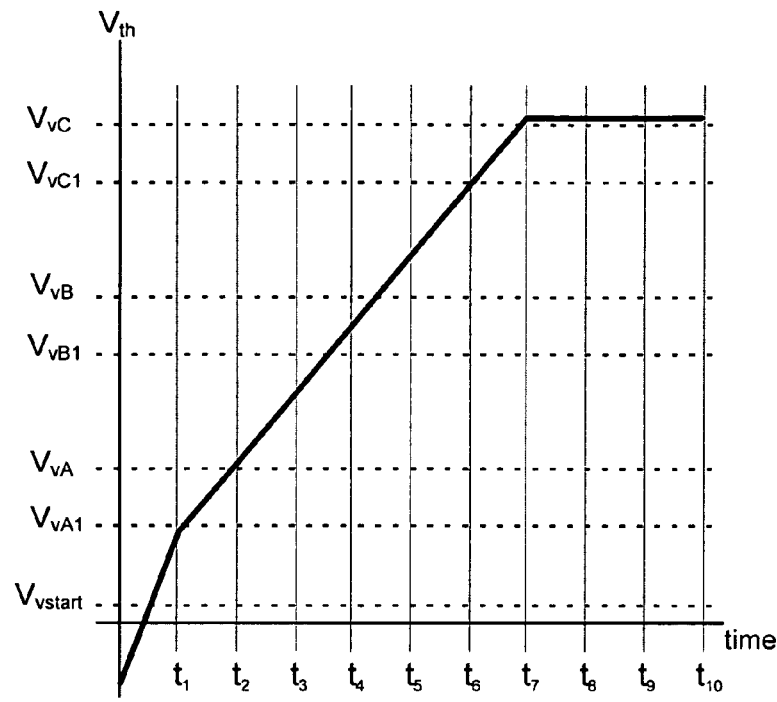
FIGS. 22A–22C depict one embodiment of a programming process.
Figure 22B:
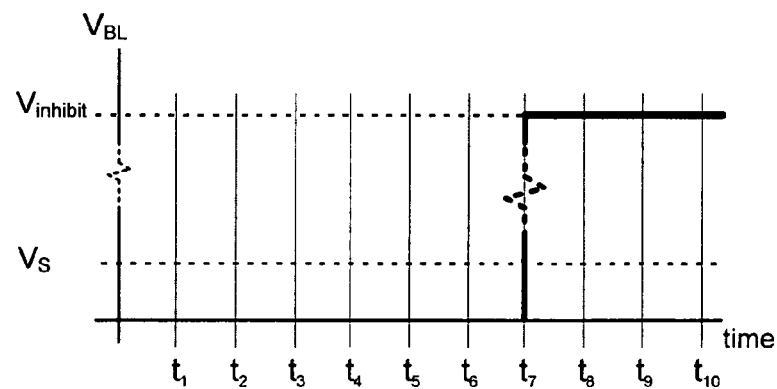
Figure 22A:
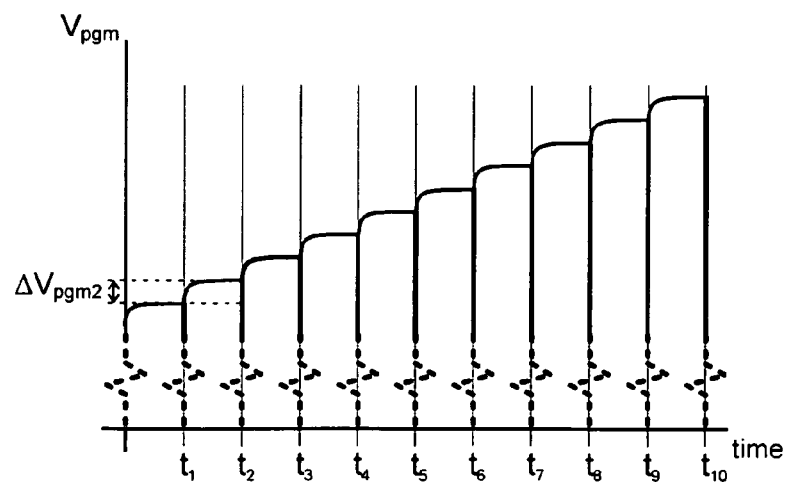
Figure 23C:
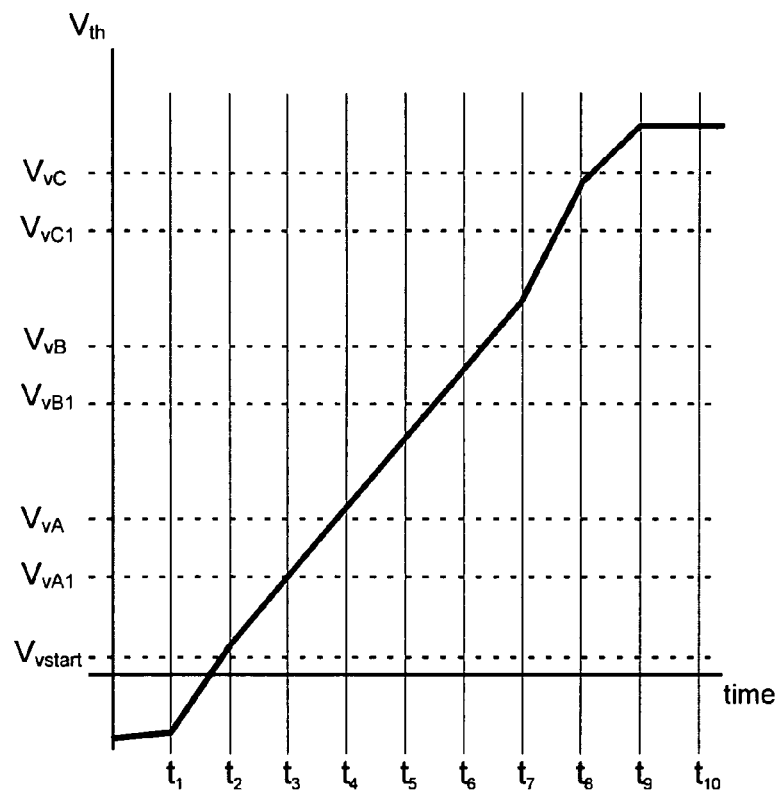
FIGS. 23A–23C depict one embodiment of a programming process.
Figure 23B:
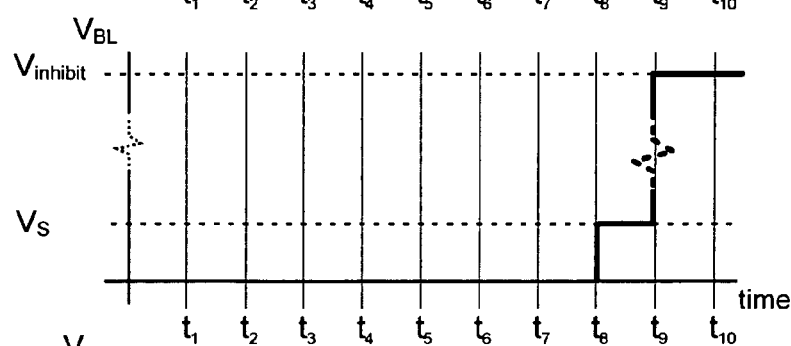
Figure 23A:
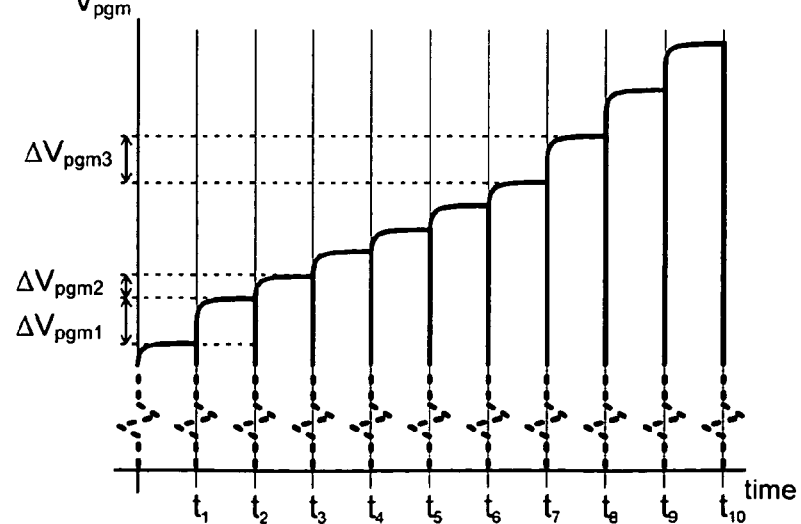

FIGS. 22 and 23 include graphs that depict the use of the technology described with respect to FIG. 20 in conjunction with coarse/fine programming. FIGS. 22A, 22B, and 22C depict the behavior of a fast memory cell which has a threshold voltage that passes both the course and target verify levels in the same pulse so that the memory cell does not enter the fine mode. FIGS. 23A, 23B, and 23C depict a slower memory cell that participates in both the coarse and fine modes. In FIGS. 22A–22C and 23A–23C, programming a memory cell to the highest state level is illustrated. It is assumed for purposes of this example, that programming of memory cells to the lower states completes at $t_7$. FIGS. 22A and 23A depict programming pulses $V_{pgm}$ applied to the control gates of the memory cells being programmed. FIGS. 22B and 23B depict bit line voltages $V_{BL}$ for the memory cells being programmed. FIGS. 22C and 23C depict the threshold voltages for the memory cells being programmed.

With respect to FIGS. 22A–22C a fast memory cell is depicted. In response to a first pulse that starts at time $t_0$, the memory cell's threshold voltage is raised above $V_{vstart}$. Therefore, the page that includes this memory cell is programmed more slowly. As such, the magnitude of subsequent programming pulse will increase by $\Delta V_{pgm2}$. Note that in one embodiment, $V_{vstart}$ may be 0.2V to 0.3V lower than $V_{vA1}$. In between $t_6$ and $t_7$, the threshold voltage of the memory cell rises above both $V_{vC1}$ and $V_{vC}$. At $t_7$, the bit line voltage will be raised to Vinhibit in order to inhibit any further programming. Additionally, because the threshold voltage of the memory cell rises above both $V_{vC1}$ and $V_{vC}$ after applying the program voltage at $t_6$, the cell does not enter the fine programming mode. Because the threshold voltage of the memory cell rises above $V_{vC}$ prior to $t_7$, a larger program voltage step size than $\Delta V_{pgm2}$ is not used to complete programming of the cell after that time.

With respect to the slower memory cell of FIGS. 23A–23C, the threshold voltage of the memory cell will not rise above $V_{vstart}$ until the period between $t_1$ and $t_2$. Thus, programming pulses will increment by $\Delta V_{pgm1}$ prior to $t_2$. Because the threshold voltage of the memory cell is greater than $V_{vstart}$ at $t_2$, the increment value is changed at $t_2$ to $\Delta V_{pgm2}$. At time $t_7$, all cells for the lower memory states have reached their target levels. Accordingly, the increment value is then changed to $\Delta V_{pgm3}$ and subsequent pulses increase in magnitude by $\Delta V_{pgm3}$. The threshold voltage in the memory cell increases above $V_{vC1}$ between $t_7$ and $t_8$. Therefore, the memory cell enters the fine programming phase and the bit line is raised to $V_S$ at $t_8$. In between $t_8$ and $t_9$, the threshold voltage increase is slowed down due to the increase in bit line voltage. The threshold voltage becomes greater than $V_{vC}$ between $t_8$ and $t_9$. Since the threshold voltage has reached its target level, the bit line voltage is raised to $V_{inhibit}$ in order to inhibit further programming at $t_9$.

Note that FIGS. 22A and 23A show the programming pulses adjacent to each other to make the graph easier to read. However, there are actually time spaces between the pulses to allow for the verify operations as depicted in FIGS. 16 and 17.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method for programming non-volatile storage, comprising:
   applying a program voltage signal to a set of non-volatile storage elements;
   programming a first subset of said set of non-volatile storage elements to a first target state by increasing said program voltage signal by a first increment value until each non-volatile storage element of said first subset reaches said first target state; and
   programming a second subset of said set of non-volatile storage elements to a second target state, said programming said second subset includes said increasing said program voltage signal by said first increment value until each non-volatile storage element of said first subset reaches said first target state and increasing said program voltage signal by a second increment value after each non-volatile storage element of said first subset reaches said first target state.

2. The method of claim 1, wherein:
   said set of non-volatile storage elements is a set of non-volatile storage elements adapted to store data in one of four states; and
   said first target state includes a threshold voltage range that is less than a threshold voltage range of said second target state.

3. The method of claim 2, wherein:
   said second target state includes a highest threshold voltage range of said four states; and
   said first target state includes a second highest threshold voltage range of said four states.

4. The method of claim 1, wherein said step of programming said first subset includes:
   verifying whether individual non-volatile storage elements of said first subset have reached a first target level for said first target state prior to said increasing said program voltage signal by said first increment value;
   inhibiting programming of individual non-volatile storage elements of said first subset that reach said first target level; and
   repeating said verifying, increasing said program voltage signal by said first increment value, and inhibiting until each non-volatile storage element of said first subset reaches said first target level.

5. The method of claim 1, wherein said step of programming said second subset includes, prior to each non-volatile storage element of said first subset reaching said first target state:
   verifying whether individual non-volatile storage elements of said second subset have reached a second target level for said second target state;
   inhibiting programming of individual non-volatile storage elements of said second subset that reach said second target level; and
   repeating said verifying, inhibiting, and increasing said program voltage signal by said first increment value until each non-volatile storage element of said first subset reaches said first target level;
   wherein said verifying and inhibiting are performed prior to said increasing said program voltage by said first increment value.

6. The method of claim 5, wherein said step of programming said second subset further includes, after each non-volatile storage element of said first subset reaches said first target state:
- performing said verifying prior to said increasing said program voltage signal by said second increment value;
- performing said step of inhibiting; and
- repeating said verifying prior to said increasing said program voltage signal by said second increment value, inhibiting, and increasing said program voltage signal by said second increment value until each non-volatile storage element of said second subset reaches said second target state.

7. The method of claim 5, wherein said step of programming said second subset further includes, after each non-volatile storage element of said first subset reaches said first target state:
- verifying said second subset by determining whether individual non-volatile storage elements of said second subset have reached said second target level for said second target state and determining whether individual non-volatile storage elements of said second subset that have not reached said second target level have reached a coarse/fine target level for said second state;
- performing said step of inhibiting;
- programming individual storage elements of said second subset that have not reached said coarse/fine target level with a first bit line voltage;
- programming individual storage elements of said second subset that have reached said coarse/fine target level but not said second target level with a second bit line voltage; and
- repeating said steps of verifying said second subset by determining, inhibiting, and programming individual storage elements of said second subset until each non-volatile storage element of said second subset reaches said second target level.

8. The method of claim 5, wherein said step of programming said second subset further includes, after each non-volatile storage element of said first subset reaches said first target state:
- verifying said second subset by determining whether individual non-volatile storage elements of said second subset have reached said second target level for said second target state and determining whether individual non-volatile storage elements of said second subset that have not reached said second target level have reached a coarse/fine target level for said second state;
- performing said step of inhibiting;
- programming individual storage elements of said second subset that have not reached said coarse/fine target level with a first bit line voltage;
- programming individual storage elements of said second subset that have reached said coarse/fine target level but not said second target level with a second bit line voltage, said programming individual storage elements of said second subset that have reached said coarse/fine target level but not said second target level includes applying a single pulse of said program voltage and verifying those individual storage elements as having reached said second target level regardless of whether they actually reach said second target level; and
- repeating said steps of verifying said second subset by determining, inhibiting, and programming individual storage elements of said second subset until each non-volatile storage element of said second subset is verified as reaching said second target level.

9. The method of claim 1, wherein said step of programming said second subset further includes, after each non-volatile storage element of said first subset reaches said first target state:
- increasing said program voltage signal by a third increment value for a first pulse after each non-volatile storage element of said first subset reaches said first target state, then increasing said program voltage signal by said second increment value, said third increment value is larger than said second increment value.

10. The method of claim 1, wherein:
said second increment value is larger than said first increment value.

11. The method of claim 1, wherein:
said program voltage signal is a common control gate voltage signal received by all non-volatile storage elements in said set of non-volatile storage elements.

12. The method of claim 11, wherein:
said program voltage signal includes a set of pulses increasing at a magnitude in accordance with said first increment value or said second increment value.

13. The method of claim 1, wherein:
said set of non-volatile storage elements corresponds to a page of data.

14. The method of claim 1, wherein:
said set of non-volatile storage elements includes NAND flash memory devices.

15. The method of claim 1, wherein:
said set of non-volatile storage elements includes multi-state flash memory devices.

16. The method of claim 1, wherein:
said set of non-volatile storage elements includes NAND multi-state flash memory devices.

17. The method of claim 1, wherein:
said first subset of non-volatile storage elements is part of a larger subset of non-volatile storage elements of said set intended for programming to said first target state;
said larger subset includes non-volatile storage elements that are not successfully programmed to said first target state; and
said non-volatile storage elements that are not successfully programmed to said first target state are handled using error correction during read operations.

18. The method of claim 1, wherein:
said method further comprises programming a third subset of said set of non-volatile storage elements to a third target state by increasing said program voltage signal by said first increment value until each non-volatile storage element of said third subset reaches said third target state; and
said programming said second subset comprises only increasing said program voltage signal by said second increment value after each non-volatile storage element of said first subset reaches said first target state and each non-volatile storage element of said third subset reaches said third target state.

19. The method of claim 1, wherein:
programming said first subset includes increasing said program voltage signal by a third increment value until a portion of said first subset reaches a first verify level and then increasing said program voltage signal by said first increment value until each non-volatile storage element of said first subset reaches said first target state;
said third increment value is larger than said first increment value; and said first verify level is lower than a verify level for determining whether a non-volatile storage element is programmed to said first target state.

20. A non-volatile storage system, comprising:
a set of non-volatile storage elements; and
one or more control circuits in communication with said set of non-volatile storage elements, said one or more control circuits program said set of non-volatile storage elements by:
  applying a program voltage signal to said set of non-volatile storage elements,
  programming a first subset of said set of non-volatile storage elements to a first target state by increasing said program voltage signal by a first increment value until each non-volatile storage element of said first subset reaches said first target state, and
  programming a second subset of said set of non-volatile storage elements to a second target state, said programming said second subset includes said increasing said program voltage signal by said first increment value until each non-volatile storage element of said first subset reaches said first target state and increasing said program voltage signal by a second increment value after each non-volatile storage element of said first subset reaches said first target state.

21. The non-volatile storage system of claim 20, wherein:
said second target state includes a higher threshold voltage range than said first state.

22. The non-volatile storage system of claim 20, wherein said step of programming said second subset further includes, after each non-volatile storage element of said first subset reaches said first target state:
  verifying whether individual non-volatile storage elements of said second subset have reached a second target level for said second target state prior to said increasing said program voltage signal by said second increment value;
  inhibiting programming of individual non-volatile storage elements of said second subset that reach said second target level; and
  repeating said verifying, inhibiting, and increasing said program voltage signal by said second increment value until each non-volatile storage element of said second subset reaches said second target level.

23. The non-volatile storage system of claim 20, wherein said step of programming said second subset further includes, after each non-volatile storage element of said first subset reaches said first target state:
  verifying said second subset by determining whether individual non-volatile storage elements of said second subset have reached a second target level for said second target state and determining whether individual non-volatile storage elements of said second subset that have not reached said second target level have reached a coarse/fine target level for said second state;
  inhibiting programming of individual non-volatile storage elements of said second subset that reach said second target level;
  programming individual storage elements of said second subset that have not reached said coarse/fine target level with a first bit line voltage;
  programming individual storage elements of said second subset that have reached said coarse/fine target level but not said second target level with a second bit line voltage; and
  repeating said steps of verifying, inhibiting, and programming individual storage elements of said second subset until each non-volatile storage element of said second subset reaches said second target level.

24. The non-volatile storage system of claim 20, wherein:
said second target state includes a higher threshold voltage range than said first target state; and
said second increment value is larger than said first increment value.

25. The non-volatile storage system of claim 20, wherein:
said program voltage signal is a common control gate voltage signal received by all non-volatile storage elements in said set of non-volatile storage elements.

26. The non-volatile storage system of claim 20, wherein:
said set of non-volatile storage elements corresponds to a page of data.

27. The non-volatile storage system of claim 20, wherein:
said set of non-volatile storage elements includes NAND multi-state flash memory devices.

28. The non-volatile storage system of claim 20, wherein said one or more control circuits includes at least one of a command circuit, a state machine, a row control circuit, a column control circuit, a well control circuit, a source control circuit, a data input/output circuit, and a controller.

29. A method for programming non-volatile storage, comprising:
  programming a set of non-volatile storage elements by applying a program voltage signal to said set of non-volatile storage elements;
  determining whether a first subset of said set of non-volatile storage elements has reached a first target state;
  determining whether a second subset of said set of non-volatile storage elements has reached a second target state;
  increasing said program voltage signal by a first increment value if said first subset has not reached said first target state;
  repeating said determining whether a first subset, determining whether a second subset, and increasing said program voltage by a first increment value until said first subset reaches said first target state;
  increasing said program voltage signal by a second increment value after said first subset has reached said first target state and said second subset has not reached said second target state; and
  repeating said step of determining whether a second subset of said set of non-volatile storage elements has reached a second target state and said step of increasing said program voltage signal by a second step size until said second subset reaches said second target state.

30. The method of claim 29, wherein:
said step of determining whether a first subset of said set of non-volatile storage elements has reached a first target state includes determining whether individual non-volatile storage elements of said first subset have reached a verify level for said first target state; and
said step of determining whether a second subset of said set of non-volatile storage elements has reached a second target state includes determining whether individual non-volatile storage elements of said second subset have reached a verify level for said second target state.

31. The method of claim 29, wherein, when said first subset has reached said first target state:
said step of determining whether a second subset of said set of non-volatile storage elements has reached a second target state includes:

determining whether individual non-volatile storage elements of said second subset have reached a verify level for said second state, and determining whether individual non-volatile storage elements of said second subset that have not reached said second verify level have reached a coarse/fine verify level for said second state; and said step of programming includes:

applying a first bit line voltage to bit lines of said individual storage elements of said second subset that have not reached said coarse/fine verify level, and applying a second bit line voltage to bit lines of said individual storage elements of said second subset that have reached said coarse/fine verify level but not said second verify level.

32. The method of claim 31, wherein, for said individual storage elements of said second subset that have reached said coarse/fine verify level but not said second verify level, said step of programming further includes:

applying a single additional pulse of said program voltage signal; and verifying said individual storage elements as having reached said second target level regardless of whether they actually reach said second target level.

33. The method of claim 29, wherein:

said second target state includes a higher threshold voltage range than said first target state; and said second increment value is larger than said first increment value.

34. The method of claim 29, wherein:

said set of non-volatile storage elements is a set of non-volatile storage elements adapted to store data in one of four or more states;

said second target state includes a highest threshold voltage range of said four or more states; and said first target state includes a second highest threshold voltage range of said four or more states.

35. The method of claim 29, wherein:

said program voltage signal is a common control gate voltage received by all non-volatile storage elements in said set of non-volatile storage elements; and said program voltage includes a set of pulses increasing at a magnitude in accordance with said first increment value or said second increment value.

36. The method of claim 29, wherein:

said set of non-volatile storage elements include NAND multi-state flash memory devices.

37. A method of programming non-volatile storage, comprising:

determining whether a set of non-volatile storage elements includes at least a minimum number of fast programming non-volatile storage elements, said set includes a first subset of non-volatile storage elements to be programmed to a first target state and a second subset of non-volatile storage elements to be programmed to a second target state;

if said set of non-volatile storage elements includes at least said minimum number of fast programming non-volatile storage elements, programming said set of non-volatile storage elements with a control gate voltage signal having a first increment value until said first subset of non-volatile storage elements is verified as having reached said first target state, and programming said set of non-volatile storage elements with said control gate voltage signal having a second increment value until said second subset of non-volatile storage elements is verified as having reached said second target state; and if said set of non-volatile storage elements does not include at least said minimum number of fast programming non-volatile storage elements, programming said set of non-volatile storage elements with said control gate voltage signal having a third increment value until a portion of non-volatile storage elements in said set reaches a first level, then programming said set with said control gate voltage signal having said first increment value until said first subset of non-volatile storage elements is verified as having reached said first target state, and then programming said set of non-volatile storage elements with said control gate voltage signal having said second increment value until said second subset of non-volatile storage elements is verified as having reached said second target state;

wherein said minimum number of fast programming non-volatile storage elements is less than all non-volatile storage elements of said set of non-volatile storage elements that are successfully programmed.

38. The method of claim 37, wherein:

said first increment value is less than said second increment value and said third increment value.

39. The method of claim 38, wherein:

said third increment value is less than said second increment value.

40. The method of claim 38, wherein:

said third increment value is greater than said second increment value.

41. The method of claim 37, wherein:

said first target state includes a lower threshold voltage range than said second target state.

42. The method of claim 37, wherein:

said set of non-volatile storage elements corresponds to a page of data.

43. The method of claim 37, wherein:

said set of non-volatile storage elements includes NAND multi-state flash memory devices.

44. The method of claim 37, wherein:

said first subset is verified as having reached said first target state by determining whether a number of non-volatile storage elements of said first subset that have not reached said first target state is less than or equal to a predetermined maximum number; and said second subset is verified as having reached said second target state by determining whether a number of non-volatile storage elements of said second subset that have not reached said second target state is less than or equal to said predetermined maximum number.

45. The method of claim 37, wherein:

said first level is lower than a lowest threshold voltage range corresponding to said first target state.

* * * * *